(12) United States Patent
Bawendi et al.

(10) Patent No.: US 8,748,933 B2
(45) Date of Patent: *Jun. 10, 2014

(54) NANOCRYSTALS INCLUDING III-V SEMICONDUCTORS

(75) Inventors: Moungi G. Bawendi, Cambridge, MA (US); Sang-wook Kim, Brookline, MA (US); John P. Zimmer, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 18 days.

This patent is subject to a terminal disclaimer.

(21) Appl. No.: 13/417,894

(22) Filed: Mar. 12, 2012

(65) Prior Publication Data

US 2012/0193606 A1    Aug. 2, 2012

Related U.S. Application Data

(63) Continuation of application No. 11/032,163, filed on Jan. 11, 2005, now Pat. No. 8,134,175.

(51) Int. Cl.
H01L 29/12    (2006.01)
(52) U.S. Cl.
USPC ................... 257/103; 257/E29.071; 977/773; 977/830
(58) Field of Classification Search
None
See application file for complete search history.

(56) References Cited

U.S. PATENT DOCUMENTS

| | | |
|---|---|---|
| 5,147,841 A | 9/1992 | Wilcoxon |
| 5,262,357 A | 11/1993 | Alivisatos et al. |
| 5,293,050 A | 3/1994 | Chapple-Sokol et al. |
| 5,354,707 A | 10/1994 | Chapple-Sokol et al. |
| 5,395,791 A | 3/1995 | Cheng et al. |
| 5,422,489 A | 6/1995 | Bhargava |
| 5,434,878 A | 7/1995 | Lawandy |
| 5,492,080 A | 2/1996 | Ohkawa et al. |
| 5,499,260 A | 3/1996 | Takahashi et al. |
| 5,505,928 A | 4/1996 | Alivisatos et al. |
| 5,515,393 A | 5/1996 | Okuyama et al. |
| 5,525,377 A | 6/1996 | Gallagher et al. |
| 5,537,000 A | 7/1996 | Alivisatos et al. |
| 5,541,948 A | 7/1996 | Krupke et al. |
| 5,585,640 A | 12/1996 | Huston et al. |
| 5,625,456 A | 4/1997 | Lawandy |
| 5,711,803 A | 1/1998 | Pehnt et al. |
| 5,747,180 A | 5/1998 | Miller et al. |
| 5,751,018 A | 5/1998 | Alivisatos et al. |

(Continued)

FOREIGN PATENT DOCUMENTS

| | | |
|---|---|---|
| WO | WO 95/29473 | 11/1995 |
| WO | WO 98/04740 | 2/1998 |

(Continued)

OTHER PUBLICATIONS

Akerman, M.E., et al. "Nanocrystal targeting in vivo," *Proc. Natl. Acad. Sci. USA*, vol. 99, No. 20, 12617-12621 (Oct. 1, 2002).

(Continued)

*Primary Examiner* — Benjamin Sandvik
(74) *Attorney, Agent, or Firm* — Steptoe & Johnson LLP

(57) ABSTRACT

Semiconductor nanocrystals including III-V semiconductors can include a core including III-V alloy. The nanocrystal can include an overcoating including a II-VI semiconductor.

19 Claims, 14 Drawing Sheets

(56) References Cited

U.S. PATENT DOCUMENTS

| | | | |
|---|---|---|---|
| 5,882,779 | A | 3/1999 | Lawandy |
| 5,985,173 | A | 11/1999 | Gray et al. |
| 5,985,353 | A | 11/1999 | Lawton et al. |
| 5,990,479 | A | 11/1999 | Weiss et al. |
| 6,054,495 | A | 4/2000 | Markowitz et al. |
| 6,057,561 | A | 5/2000 | Kawasaki et al. |
| 6,114,038 | A | 9/2000 | Castro et al. |
| 6,179,912 | B1 | 1/2001 | Barbera-Guillem et al. |
| 6,207,229 | B1 | 3/2001 | Bawendi et al. |
| 6,224,739 | B1 | 5/2001 | Reetz et al. |
| 6,251,303 | B1 | 6/2001 | Bawendi et al. |
| 6,262,129 | B1 | 7/2001 | Murray et al. |
| 6,319,426 | B1 | 11/2001 | Bawendi et al. |
| 6,322,901 | B1 | 11/2001 | Bawendi et al. |
| 6,326,144 | B1 | 12/2001 | Bawendi et al. |
| 6,379,635 | B2 | 4/2002 | O'Brien et al. |
| 6,447,698 | B1 | 9/2002 | Ihara et al. |
| 6,576,291 | B2 | 6/2003 | Bawendi et al. |
| 6,617,583 | B1 | 9/2003 | Bawendi et al. |
| 6,633,370 | B2 | 10/2003 | Lawandy |
| 6,682,596 | B2 | 1/2004 | Zehnder et al. |
| 6,794,265 | B2 | 9/2004 | Lee et al. |
| 6,821,337 | B2 | 11/2004 | Bawendi et al. |
| 8,134,175 | B2 * | 3/2012 | Bawendi et al. ............. 257/103 |
| 2002/0004246 | A1 | 1/2002 | Daniels et al. |
| 2002/0066401 | A1 | 6/2002 | Peng et al. |
| 2002/0071952 | A1 | 6/2002 | Bawendi et al. |
| 2002/0144644 | A1 | 10/2002 | Zehnder et al. |
| 2003/0017264 | A1 | 1/2003 | Treadway et al. |
| 2004/0091710 | A1 | 5/2004 | Bawendi et al. |
| 2004/0110002 | A1 | 6/2004 | Kim et al. |
| 2005/0002635 | A1 | 1/2005 | Banin et al. |
| 2005/0020922 | A1 | 1/2005 | Frangioni et al. |
| 2005/0020923 | A1 | 1/2005 | Frangioni et al. |
| 2005/0112849 | A1 | 5/2005 | Stott et al. |

FOREIGN PATENT DOCUMENTS

| | | |
|---|---|---|
| WO | WO98/19963 | 5/1998 |
| WO | WO 98/33070 | 7/1998 |
| WO | WO 98/36376 | 8/1998 |
| WO | WO 98/46372 | 10/1998 |
| WO | WO99/26299 | 5/1999 |
| WO | WO00/17103 | 3/2000 |
| WO | WO00/17642 | 3/2000 |
| WO | WO00/17655 | 3/2000 |
| WO | WO00/17656 | 3/2000 |
| WO | WO01/07689 | 2/2001 |
| WO | WO03/084292 | 10/2003 |
| WO | WO2004/066361 | 8/2004 |

OTHER PUBLICATIONS

Aktsipetrov, O.A., et al. "Generation of reflected second harmonic at semiconductor quantum dots," *JETP Letters*, vol. 55, No. 8, 435-439 (1992).

Alivisatos, A.P. "Perspectives on the Physical Chemistry of Semiconductor Nanocrystals", *J. Phys. Chem.*, 100:13226 (Aug. 1996).

Alivisatos, A.P. "Semiconductor Clusters, Nanocrystals, and Quantum Dots," *Science*, 271:933-937 (Feb. 16, 1996).

Alivisatos, A.P., et al. "Organization of 'nanocrystal molecules' using DNA" *Nature*, vol. 382, 609-611 (Aug. 15, 1996).

Bailey, R.E., et al. "Alloyed Semiconductor Quantum Dots: Tuning the Optical Properties without Changing the Particle Size" *J. Am. Chem. Soc.* 2003, 125, 7100-7106.

Baltrameyunas, R., et al. "Fast switching of the transmission of light by glasses activated with CdS microcrystals," *Sov. Phys. Semicond.*, vol. 25 No. 2, 164-166 (1991).

Baltramiejunas, R., et al. "Rapid Processes of Darkening and Bleaching in CdS Doped Glasses," *Superlattices and Microstructures* vol. 10, No. 3, 307-310 (1990).

Battaglia, D., et al. "Formation of High Quality InP and InAs Nanocrystals in a Noncoordinating Solvent" *Nano Letters* 2002, 2, 1027-1030.

Bawendi, M.G., et al. "Electronic Structures and Photoexcited-Carrier Dynamics in Nanometer-Size CdSe Clusters." *Physical Review Letters*, vol. 65, No. 11, pp. 1623-1626, (1990).

Bawendi, M.G., et al. "X-ray structural characterization of larger CdSe semiconductor clusters," *J. Chem. Phys.*, vol. 91, No. 11, pp. 7282-7290, (1989).

Bawendi, M.G., et al. "Luminescence properties of CdSe quantum crystallites: resonance between interior and surface localized states," *J. Chem. Phys.*, 96(2):946-954, 1992.

Becker, V.G., G. Gutekunst, H.J. Wessely, Z. Anorg. Allg. Chem. 1980, 462, 113.

Beverloo, H.B., et al. "Preparation and Microscopic Visualization of Multicolor Luminescent Immunophosphors," *Cytometry*, 13:561-570, 1992.

Bhargava, R.N., et al. "Quantum Confined Atoms of Doped ZnO Nanocrystals", *Phys. Stat. Sol* (b) 229, No. 2, 897-901 (2002).

Bruchez, Jr., M., et al. "Semiconductor Nanocrystals as Fluorescent Biological Labels," *Science*, vol. 281, 2013-2016 (Sep. 25, 1998).

Bugaj, J.E., et al. "Novel fluorescent contrast agents for optical imaging of in vivo tumors based on a receptor-targeted dye-peptide conjugate platform," *Journal of Biomedical Optics*, vol. 6, No. 2, 122-133 (Apr. 2001).

Bunge, S.D., et al. "Growth and morphology of cadmium chalcogenides: the synthesis of nanorods, tetrapods, and spheres from CdO and $Cd(O_2CCH_3)_2$" *J. Mater. Chem.*, 2003, 13, 1705-1709.

Cao, Y.W., Banin, U. *J. Am. Chem. Soc.* 2000, 122, 9692.

Cao, Y.W., U. Banin, *Angew. Chem.* 1999, 111, 3913.

Cao, Y.W., U. Banin, *Angew. Chem. Int. Ed*, 1999, 38, 3692.

Cerussi, A.E., et al. "Sources of Absorption and Scattering Contrast for Near-Infrared Optical Mammography," *Acad. Radiol.*, vol. 8, No. 3, 211-218 (Mar. 2001).

Chamarro, M., et al. "Enhancement of electron-hole exchange interaction in CdSe nanocrystals: A quantum confinement effect," *Physical Review B*, vol. 53, No. 3, Jan. 15, 1996-I, 1336-1342.

Chamarro, M., et al. "Enhancement of Exciton Exchange Interaction by Quantum Confinement in CdSe Nanocrystals," *Jpn. J. Appl. Phys*, vol. 34, 12-14 (1994).

Chamarro, M., et al. "Size-dependent Electron-Hole Exchange Interaction in CdSe Quantum Dots, *Il Nuovo Cimento*," vol. 17, Nos. 11-12, (1995) 1407-1412.

Chan et al., Curr Opin Biotechnol 13:40-46 (2002).

Chan, E.M., et al. "Size-Controlled Growth of CdSe Nanocrystals in Microfluidic Reactors," *Nano Letters*, vol. 3, No. 2, 199-201 (2003).

Chan, W.C.W., et al. "Quantum Dot Bioconjugates for Ultrasensitive Nonisotopic Detection" *Science* 1998, 281, 2016-2018.

Chen, F., et al. "Synthesis and properties of Lead Selenide Nanocrystal Solids" *Mat. Res. Soc. Symp. Proc.* 691, 2002, 359-364.

Cheong, W-F., et al. "A Review of the Optical Properties of Biological Tissues," *IEEE J. Quantum Electronics* 26, 2166-2195 (1990).

Chepic, D.I., et al. "Auger ionization of semiconductor quantum drops in a glass matrix," *Journal of Luminescence* 47 (1990) 113-127 North-Holland.

Coe, S., et al. "Electroluminescence from single monolayers of nanocrystals in molecular organic devices," *Nature* 2002, 420, 800-803.

Colvin, V.L., et al. "Light-emitting diodes made from cadmium selenide nanocrystals and a semiconducting polymer" *Nature*, 370(6488):354-357, Aug. 4, 1994.

Correa-Duarte M.A., et al. "Stabilization of CdS semiconductor nanoparticles against photodegradation by a silica coating procedure," *Chemical Physics Letters* 286:497-501 (1998).

Cumberland, S.L., et al. "Inorganic Clusters as Single Source Precursors for Preparation of CdSe, ZnSe, and CdSe/ZnS Nanomaterials" *Chem. Mater.* 2002, 14, 1576-1584.

Dabbousi, B.O., et al. "(CdSe)ZnS Core-Shell Quantum Dots: Synthesis and Characterization of a Size Series of Highly Luminescent Nanocrystallites," *The Journal of Physical Chemistry B*, 101(46):9463-9475 (1997).

Dabbousi, B.O., et al. "Electroluminescence from CdSe quantum-dot/polymer composites," *Appl. Phys. Lett.* 66 (11):1316-1318 (1995).

(56) References Cited

OTHER PUBLICATIONS

Danek, M., et al. "Synthesis of Luminescent Thin-Film CdSe/ZnSe Quantum Dot Composites Using CdSe Quantum Dots Passivated with an Overlayer of ZnSe" Chem. Mater.,8(1):173-180, 1996.

de Mello, J., et al., "Microscale reactors: nanoscale products," Lab Chip 2004, 4, 11N-15N.

Dneproviskii, V.S., et al. "Time-Resolved Luminescence of CdSe Microcrystals," Solid State Communications, vol. 74, No. 7, pp. 555-557, 1990.

Dubertret, B., et al. "In Vivo Imaging of Quantum Dots Encapsulated in Phospholip Micelles," Science, vol. 298, 1759-1762 (Nov. 29, 2002).

Edamatsu, K., et al. "Subpicosecond dynamics of confined excitons and optical nonlinearities of CuCl quantum dots," Journal of Luminescence 66 & 67 (1996) 406-409.

Edel, J.B., et al. "Microfluidic routes to the controlled production of nanoparticles," Chem. Comm. 2002, 1136-1137.

Efros, A.L., et al. "Resonance Raman Spectroscopy of Electron-Hole Pairs—Polar Phonon Coupling in Semiconductor Quantum Microcrystals," Solid State Communications, vol. 78, No. 10, pp. 853-856, 1991.

Eisler, H-J., et al. "Color-selective semiconductor nanocrystal laser," Applied Physics Letters, vol. 80, No. 24, 4614-4616 (Jun. 17, 2002).

Ekimov, A.I. "Growth and optical properties of semiconductor nanocrystals in a glass matrix," Journal of Luminescence 70 (1996) 1-20.

Ekimov, A.I. "Optical Properties of Oxide Glasses Doped by Semiconductor Nanocrystals," Radiation Effects and Defects in Solids, 1995, vol. 134, pp. 11-22.

Ekimov, A.I. "Optical Properties of Semiconductor Quantum Dots in Glass Matrix," Physica Scripta. vol. T39, 217-222 (1991).

Ekimov, A.I., et al. "Absorption and intensity-dependent photoluminescence measurements on CdSe quantum dots: assignment of the first electronic transitions," Journal of the Optical Society of America, vol. 10, Nos. 1-12, 100-107 (1992).

Ekimov, A.I., et al. "Dimensional Effects in Luminescence Spectra of Zero-Dimensional Semiconductor Structures," Bulletin of the Russian Academy of Sciences, vol. 56, No. 2, pp. 154-157 (Feb. 1992).

Ekimov, A.I., et al. "Donor-like Exciton in Zero-Dimension Semiconductor Structures," Solid State Communications, vol. 69, No. 5, pp. 565-568, 1989.

Ekimov, A.I., et al. "Growth of CdSe nanocrystals in ion-implanted $SiO_2$ films," Journal of Crystal Growth 151 (1995) 38-45.

Ekimov, A.I., et al. "Influence of high hydrostatic pressures on the exciton spectrum of CdS microcrystals in glass," Sov. Phys. Semicond. 23(9), Sep. 1989, pp. 965-966.

Ekimov, A.I., et al. "Nonlinear Optics of Semiconductor-Doped Glasses," Phys. Stat. Sol. (b) 150, (1988) pp. 627-633.

Ekimov, A.I., et al. "Optics of Zero Dimensional Semiconductor Systems, Acta Physica Polonica A," vol. 79 (1991), No. 1. pp. 5-14.

Ekimov, A.I., et al. "Photoluminescence of quasizero-dimensional semiconductor structures," Sov. Phys. Solid State 31(8), Aug. 1989, pp. 1385-1393.

Ekimov, A.I., et al. "Quantization of the energy spectrum of holes in the adiabatic potential of the electron," JETP Lett., vol. 43, No. 6, Mar. 25, 1986, pp. 376-379.

Ekimov, A.I., et al. "Quantum Size Effect in Semiconductor Microcrystals," Solid State Communications, vol. 56, No. 11, pp. 921-924, 1985.

Ekimov, A.I., et al. "Quantum size effect in the optical spectra of semiconductor microcrystals," Sov. Phys. Semicond. 16(7), Jul. 1982, pp. 775-778.

Ekimov, A.I., et al. "Quantum size effect in three-dimensional microscopic semiconductor crystals," JETP Lett, vol. 34, No. 6, Sep. 20, 1981, pp. 345-349.

Ekimov, A.I., et al. "Quantum-Size Stark Effect in Semiconductor Microcrystals," Journal of Luminescence 46 (1990) 97-100 North-Holland.

Ekimov, A.I., et al. "Size quantization of the electron energy spectrum in a microscopic semiconductor crystal," JETP Lett., vol. 40, No. 8, Oct. 25, 1984, pp. 1136-1139.

Ekimov, A.I., et al. "Spectra and Decay Kinetics of Radiative Recombination in CdS Microcrystals," Journal of Luminescence 46 (1990) 83-95 North-Holland.

Empedocles, S.A., et al. "Photoluminescense Spectroscopy of Single CdSe Nanocrystallite Quantum Dots", Phys. Rev. Lett., 77(18):3873 (Oct. 1996).

Evens, A.M., M.S. Tallman, R.B. Gartenhaus, Leuk. Res. 2004, 28, 891.

Furdyna, J.K. J. Appl. Phys. 1988, 64, R29.

Gan, L.M., et al. "Enhanced Photoluminescence and Characterization of Mn-Doped ZnS Nanocrystalline Synthesized in Microemulsion," Langmuir, 1997 (13):6427-6431, 1997.

Gao, M., et al. "Strongly Photoluminenscent CdTe Nanocrystals by Proper Surface Modification," J. Phys. Chem. B 102:8360-8363 (1998).

Gaponik, N., et al. "Thiol-Capping of CdTe Nanocrystals: An Alternative to Organometallic Synthetic Routes" J. Phys. Chem. B 2002, 106, 7177-7185.

Gardner, C.M., et al. "Light Transport in Tissue: Accurate Expressions for One-Dimensional Fluence Rate and Escape Function Based Upon Monte Carlo Simulation," Lasers Surg. Med. 18:129-138(1996).

Gerio, D., et al. "Sorting Fluorescent Nanocrystals with DNA," J. Am. Chem. Soc., vol. 124, No. 24, 7070-7074 (Jun. 19, 2002).

Goldman, E.R., et al. "Avidin: A Natural Bridge for Quantum Dot-Antibody Conjugates," J. Am. Chem. Soc., vol. 124, No. 22, 6378-6382 (Jun. 5, 2002).

Goldman, E.R., et al. "Conjugation of Luminescent Quantum Dots with Antibodies Using an Engineered Adaptor Protein to Provide New Reagents for Fluoroimmunoassays," Analytical Chemistry, vol. 74, No. 4, 841-847 (Feb. 15, 2002).

Grabovskis, V.Y., et al. "Photoionization of semiconducting microcrystals in glass," Sov. Phys. Solid State 31(1), Jan. 1989, pp. 149-151.

Green, M. et al. "Recent advances in the preparation of semiconductors as isolated nanometric particles: new routes to quantum dots," Chem. Commun., 2235-2241 (1999).

Green, M., S. Norager, P. Moriarty, M. Motevalli, P. O'Brien, J. Mater. Chem. 2000, 10, 1939.

Guha, S., et al. "Hybrid organic-inorganic semiconductor-based light-emitting diodes" J. Appl. Phys., 82(8):4126-4128, Oct. 15, 1997.

Gunsalus, I.C., L.S. Barton, W. Gruber, J. Am. Chem. Soc. 1956, 78, 1763.

Gunther, A., et al. "Transport and reaction in microscale segmented gas-liquid flow" Lab Chip 2004, 4, 278-286.

Gurevich, S.A., et al. "Growth of CdS nanocrystals in silicate glasses and in thin $SiO_2$ films in the initial stages of the phase separation of a solid solution," Semiconductors, 28 (5), May 1994, 486-493.

Gurevich, S.A., et al. "Preparation and investigation of $SiO_2$ films activated by CdS semiconductor nanocrystals," Soviet Physics Semiconductors, vol. 26, 57-59 (1992).

Guzelian, A.A., et al. "Colloidal chemical synthesis and characterization of InAs nanocrystal quantum dots" Appl. Phys. Lett. 1996, 69, 1432-1434.

Harrison, M.T., et al. "Wet chemical synthesis and spectroscopic study of CdHgTe nanocrystals with strong near-infrared luminescence" Mat. Sci. Eng. B, 2000, 69-70, 355-360.

Hines, M.A., et al. "Synthesis and Characterization of Strongly Luminescing ZnS-Capped CdSe Nanocrystals," J. Phys. Chem. 100:468-471 (1996).

Huynh, W. U., Dittmer, J. J.; Alivisatos, A. P. Nature 2002, 295, 2425.

Itoh, T. et al. "Interface effects on the properties of confined excitons in CuCl microcrystals," Journal of Luminescence 60 & 61 (1994) 396-399.

Itoh, T., et al. "Polaron and Exciton-Phonon Complexes in CuCl Nanocrystals," Physical Review Letters, vol. 74, No. 9, Feb. 27, 1995, p. 1645-1648.

(56) References Cited

OTHER PUBLICATIONS

Itoh, T., et al. "Subpicosecond dynamics of confined excitons in CuCl nanocrystals," *Materials Science and Engineering* A217/218 (1996) 167-170.

Jaiswal, J.K., et al. "Long-term multiple color imaging of live cells using quantum dot bioconjugates," *Nature Biotechnology*, vol. 21, No. 1, 47-51 (Jan. 2003).

Jakub, J.W., Pendas, S.; Reintgen, D. S. Oncologist 2003, 8, 59.

Jarvis et al. "Solution Synthesis and Photoluminescence Studies of Small Crystallites of Cadmium Telluride," *Mat. Res. Soc. Symp. Proc.*, 272:229-234, 1992.

Jarvis, Jr., R.F., et al. "Solution Synthesis and Photoluminescence Studies of SMA Crystallites of Cadmium Telluride," *Mat. Res. Soc. Symp. Proc.* 272:227-234 (1992).

Jursenas, S., et al. "Surface Recombination of Nonequilibrium Electron-Hole Plasma in Laser-Modified Semiconductor-Doped Glasses," *Solid State Communications*, vol. 87, No. 6, 577-580 (1993).

Kagan, C.R., et al. "Electronic Energy Transfer in CdSe Quantum Dot Solids," *Physical Review Letters*, 76:1517-1520, Feb. 26, 1997.

Kagan, C.R., et al. "Long-Range Resonance Transfer of Electronic Excitations in Close-Packed CdSe Quantum-Dot Solids," *Physical Review Letters*, 54:8633-8643, Sep. 15, 1996.

Kazes, M., et al. "Lasing from Semiconductor Quantum Rods in a Cylindrical Microcavity," *Adv. Mater.* 2002, 14, 317-321.

Kim, S., Bawendi, M. G. *J. Am. Chem. Soc.* 2003. 125, 14652.

Kim, S., Lim, Y. T.; Soltesz, E. G.; De Grand, A. M.; Lee, J.; Nakayama, A.; Parker, J. A.; Mihaljevic, T.; Laurence, R. G.; Dor, D. M.; Cohn, L. H.; Bawendi, M. G.; Frangioni, J. V. *Nature Biotechnology 2004*, 22, 93.

Klarreich, Nature 413:450-452 (2001).

Klimov, V.I., et al. "Optical Gain and Stimulated Emission in Nanocrystal Quantum Dots," *Science*, vol. 290, No. 5490, 314-317 (Oct. 13, 2000).

Kortan, A.R., et al. "Nucleation and Growth of CdSe on ZnS Quantum Crystallite Seeds, and Vice Versa, in Inverse Micella Media", *J. Am. Chem. Soc.*, 112:1327 (1990).

Kuno, M., et al. "The band edge luminescence of surface modified CdSe nanocrystallites: Probing the luminescing state," *J. Chem. Phys.*, 106(23):9869-9882, Jun. 1997.

Larson, D.R., et al. "Water-Soluble Quantum Dots for Multiphoton Fluorescence Imaging in Vivo," *Science*, vol. 300, 1434-1436 (May 30, 2003).

Lawless, D., et al. "Bifunctional Capping of CdS Nanoparticles and Bridging to $TiO_2$," *J. Phys. Chem.*, 99:10329-10325, 1995.

Leatherdale, C.A., et al. "On the Absorption Cross Section of CdSe Nanocrystal Quantum Dots," *J. Phys. Chem. B.*, vol. 106, 7619-7622 (2002).

Lee, J-K., et al. "Surface Derivatization of Nanocrystalline CdSe Semiconductors," *Mat. Res. Soc. Symp. Proc.*, 452:323-328, Mar. 13, 1997.

Leppert, V.J., et al. "Structural and optical characteristics of ZnSe nanocrystals synthesized in the presence of a polymer capping agent", *Materials Science and Engineering B52*, pp. 89-92, (1998).

Lim, Y.T., S. Kim, A. Nakayama, N.E. Stott, M.G. Bawendi, J.V. Frangioni, *Molecular Imaging*, 2003, 2, 50.

Liz-Marzan, L.M., et al. "Synthesis of Nanosized Gold-Silica Core-Shell Particles" *Langmuir*, 12:4329-4335, 1996.

Lu, J., S. Wei, W. Yu, H. Zhang, Y. Qian, *Inorg. Chem.* 2004, 43, 4543.

Lublinskaya, O., et al. "CdS nanocrystal growth in thin silica films: evolution of size distribution function", *Journal of Crystal Growth* 184/185 (1998) 360-364.

Ludolph, B., et al. "Novel single molecule precursor routes for the direct synthesis of highly monodispersed quantum dots of cadmium or zinc sulfide or selenide," *Chem. Commun.* 1849-1850 (1998).

Malik, M.A., et al. "Semiconductor nanoparticles: their properties, synthesis and potential for application," *So. African Journal of Science* 26:55-60 (2000).

Malko, A.V., et al. "From amplified spontaneous emission to microring lasing using nanocrystal quantum dot solids," *Applied Physics Letters*, vol. 81, No. 7, 1303-1305 (Aug. 12, 2005).

Matsumoto, H., et al. "Preparation of Monodisperse CdS Nanocrystals by Size Selective Photocorrosion", *J. Phys. Chem.*, 100(32):13782 (Aug. 1996).

Mattoussi, H., et al. "Properties of CdSe nanocrystal dispersions in the dilute regime: Structure and interparticle interactions," *Physical Review B*, vol. 58, No. 12, 7850-7863 (Sep. 11, 1998).

Mattoussi, H., et al. "Self-Assembly of CdSe-ZnS Quantum Dot Bioconjugates Using an Engineered Recombinant Protein," *J. Am. Chem. Soc.*, vol. 122, 12142-12150 (2000).

Mikulec, F.V., et al. "Synthesis and Characterization of Highly Luminescent (CdSe)ZnS Quantum Dots," *Materials Research Society Symposium*, 359-364, Boston, MA, Dec. 2-6, 1997.

Mikulec, F.V., PhD thesis, Massachusetts Institute of Technology (US), 1999.

Mokari, T., et al. "Synthesis and Properties of CdSe/ZnS Core/Shell Nanorods" *Chem. Mater.* 2003, 15(20); 3955-3960.

Müllenborn, M., et al. "Characterization of Solution-Synthesized CdTe and HgTe," *Applied Physics*, 56:317-321, 1993.

Murray, C.B., et al. "Colloidal synthesis of nanocrystals and nanocrystal superlattices," *IBM J. Res. & Dev.*, vol. 45, No. 1, 47-56 (Jan. 2001).

Murray, C.B., et al. "Synthesis and Characterization of Nearly Monodisperse CdE (E = S, Se, Te) Semiconductor Nanocrystallites", *J. Am. Chem. Soc.*, 115:8706 (1993).

Nakamura, H., et al. "Preparation of CdSe nanocrystals in a microflow-reactor," *Chem. Commun.*, 2002, 2844-2845.

Nakayama, A., et al. "Functional near-infrared fluorescence imaging for cardiac surgery and targeted gene therapy," *Molecular Imaging*, 2002, vol. 1, No. 4, 365-377.

Nirmal, M., et al. "Fluorescence Intermittency in Single Cadmium Selenide Nanocrystals", *Nature*, 383:802 (Oct. 1996).

Nozik, A.J., et al. "Colloidal Quantum Dots of III-V Semiconductors," *MRS Bulletin*, 23(2):24-30 (1998).

Parungo, C. P., Ohnishi, S.; Kim, S. -W.; Kim, S.; Laurence, R. G.; Soltesz, E. G.; Chen, F. Y.; Colson, Y. L.; Cohn, L. H.; Bawendi, M. G.; Frangioni J. V. *The Journal of Thoraeic and Cardiovascular Surgery*, 2004.

Pathak, S., et al. "Hydroxylated Quantum Dots as Luminescent Probes for in Situ Hybridization," *J. Am. Chem. Soc.*, 2001, vol. 123, No. 17, 4103-4104.

Pehnt, M., et al. "Nanoparticle Precursor Route to Low-Temperature Spray Deposition of CdTe Thin Films," *Appl. Phys. Lett.*, 67(15):2176-2178, 1995.

Peng, X., et al. "Epitaxial Growth of Highly Luminescent CdSe/CdS Core/Shell Nanocrystals with Photostability and Electronic Accessibility," *J. Am. Chem. Soc.* 119: 7019-7029 (1997).

Peng, X., et al. "Kinetics of II-VI and III-V Colloidal Semiconductor Nanocrystal Growth: "Focusing" of Size Distributions," *J. Am. Chem. Soc.* 1998, 120, 5343-5344.

Peng, X., et al. "Synthesis and Isolation of a Homodimer of Cadmium Selenide Nanocrystals," *Angew. Chem. Ind. Ed. Engl.* 36:145-147 (1997).

Peng, Z.A., et al. "Formation of High-Quality CdTe, CdSe, and CdS Nanocrystals Using CdO as Precursor," *J. Am. Chem. Soc.* 2001, 123, 183-184.

Qu, L., et al. "Alternative Routes toward High Quality CdSe Nanocrystals," *Nano Letters*, vol. 1, No. 6, 333-337, 2001.

Rajh, T. "Synthesis and Characterization of Surface-Modified Colloidal CdTe Quantum Dots," *J. Phys. Chem.*, 97:11999-12003, Nov. 1993.

Resch, U., et al. "Photochemistry and Radiation Chemistry of Colloidal Semiconductors. 33. Chemical Changes and Fluorescence in CdTe and ZnTe" *Langmuir* 1989, 5, 1015-1020.

Ridley, B., et al. "All-Inorganic Field Effect Transistors Fabricated by Printing", *Science*, vol. 286, No. 5440, pp. 746-749, Oct. 22, 1999.

Rogach, A., et al. "Colloidally Prepared HgTe Nanocrystals with Strong Room-Temperature Infrared Luminescence" *Adv. Mater.* 1999, 11, 552-554.

(56) References Cited

OTHER PUBLICATIONS

Rogach, A.L., et al. "Synehesis, Morphology, and Optical Properties of Thiol-Stabilized CdTe Nanoclusters in Aqueous Solution" *Ber. Bunsenges. Phys. Chem.* 1997, 101, 1668-1670.

Rogach, A.L., et al. "Synthesis and characterization of Thiol-Stabilized CdTe Nanocrystals" *Ber. Bunsenges. Phys. Chem.*, 100(11):1772-2778, 1996.

Rosenthal, S.J., et al. "Targeting Cell Surface Receptors with Ligand-Conjugated Nanocrystals," *J. Am. Chem. Soc.*, 2002, vol. 124, 4586-4594.

Saviot, L., et al. "Effects of Resonance on Low-Frequency Raman Scattering From Semiconductor Nanocrystals," *Radiation Effects and Defects in Solids*, 1995, vol. 137, pp. 45-50.

Saviot, L., et al. "Size dependence of acoustic and optical vibrational modes of CdSe nanocrystals in glasses," *Journal of Non-Crystalline Solids* 197 (1996) 238-246.

Saviot, L., et al. "Size-selective resonant Raman scattering in CdS doped glasses," Physical Review B, vol. 57, No. 1, Jan. 1, 1998-I, 341-346.

Schlamp, M.C., et al. "Improved efficiencies in ligth emitting diodes made with CdSe (CdS) core/shell type nanocrystals and a semiconducting polymer," *J. Appl. Phys.*, vol. 82, No. 11, 5837-5842 (Dec. 1, 1997).

Sirenko, A.A., et al. "Spin-flip and acoustic-phonon Raman scattering in CdS nanocrystals", *Physical Review B*, vol. 58, No. 4, Jul. 15, 1998-II, 2077-2087.

Spanhel, L., et al. "Photochemistry of Colloidal Semiconductors. 20. Surface Modification and Stability of Strong Luminescing CdS Particles," *J. Am. Chem. Soc.* 109:5649-5655 (1987).

Steigerwald, M.L., et al. "Surface Derivatization and Isolation of Semiconductor Cluster Molecules," *J. Am. Chem. Soc.*, 110:3046-3050, 1988.

Sugimoto, T. "Preparation of Monodispersed Colloidal Particles," *Adv. Coll. Int. Sci.* 1987, 28, 65-108.

Sundar, V.C., et al. "Room-Temperature, Tunable Gain Media from Novel II-VI Nanocrystal-Titania Composite Matrices," *Adv. Mater.* 2002, 14, 739-743.

Suzuki, K., et al. "Structural and optical properties of type II GaSb/GaAs self-assembled quantum dots grown by molecular beam epitaxy" *J. Appl. Phys* 1999, 85, 8349-8352.

Talapin, D.V., et al. "Evoluation of an Ensemble of Nanoparticles in a Colloidal Solution: Theoretical Study," *J. Phys. Chem. B.*, 2001, vol. 105, 12278-12285.

Tamulaitis, G., et al. "Dynamics of Nonlinear Optical Response of CuBr-Doped Glasses," *Superlattices and Microstructures*, vol. 3, No. 2, 199-202 (1993).

Tessler, N., et al. "Efficient Near-Infrared Polymer Nanocrystal Light-Emitting Diodes," *Science* 2002, 295, 1506-1508.

Uchida, H., T. Matsunaga, H. Yoneyama, T. Sakata, H. Mori, T. Sasaki, Chem. Mater. 1993, 5, 716.

Valenta, J., et al. "Dynamics of excitons in CuBr nanocrystals: Spectral-hole burning and transient four-wave-mixing measurements," *Physical Review B*, vol. 57, No. 3, Jan. 15, 1998-I, 1774-1783.

Vandyshev, Y.V., et al. "Nonlinear optical properties of semiconductor microcrystals," *JETP Lett.*, vol. 46, No. 10, Nov. 25, 1987 pp. 435-439.

Volkov, A.S., et al. "Oscillations of polarization of recombination radiation of a variable gap semiconductor in a magnetic field," *JETP Lett.*, vol. 25 No. 12, 526-528 (1977).

Weissleder, R. "A clearer vision for in vivo imaging," *Nature Biotechnol.* 19:316-7 (2001).

Weissleder, R., et al. "In vivo imaging of tumors with protease-activated near-infrared fluorescent probes," *Nature Biotechnol.* 17:375-378 (1999).

Wu, X., et al. "Immunofluorescent labeling of cancer marker Her2 and other cellular targets with semiconductor quantum dots," *Nature Biotechnology*, Jan. 2003, vol. 21, No. 1, 41-46.

Yang, C-S., et al. "Growth of CdS Nanorods in Nonionic Amphiphilic Triblock Copolymer Systems" *Chem. Mater.* 2002, 14, 1277-1284.

Yen, B.K.H., et al. "A Continuous-Flow Microcapillary Reactor for the Preparation of a Size Series of CdSe Nanocrystals," *Adv. Mater.* 2003, 15, 1858-1862.

Zaheer, A., et al. "In vivo near-infrared fluorescence imaging f osteoblastic activity," *Nature Biotechnology*, Dec. 2001, vol. 19, 1148-1154.

\* cited by examiner

US 8,748,933 B2

NANOCRYSTALS INCLUDING III-V SEMICONDUCTORS

STATEMENT OF PRIORITY

This application claims priority to U.S. application Ser. No. 11/032,163, filed on Jan. 11, 2005, now U.S. Pat. No. 8,134,175, which is incorporated by reference in its entirety.

FEDERALLY SPONSORED RESEARCH OR DEVELOPMENT

This invention was made with government support under Grant No. 4-R33-EB000673-02, awarded by the NIH. The government has certain rights in the invention.

TECHNICAL FIELD

The invention relates to nanocrystals including III-V semiconductors.

BACKGROUND

Semiconductor nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing nanocrystal size. Consequently, both the optical absorption and emission of nanocrystals shift to the blue (i.e., to higher energies) as the size of the nanocrystals decreases. Semiconductor nanocrystals can have a narrow fluorescence band whose emission wavelength is tunable with the size and material of the nanocrystals.

SUMMARY

Semiconductor nanocrystals are excellent fluorophores due to their continuous absorption profiles at wavelengths to the blue of the band edge, high photostability, and narrow, tunable emission peaks. In order to exploit semiconductor nanocrystal properties for use in biological imaging, especially in vivo, the emission wavelength of the nanocrystals should be in a region of the spectrum where blood and tissue absorb minimally but where detectors are still efficient, such as 700-1000 nm in the near infrared (NIR). In addition, the materials should be water-soluble and water-stable, and desirably include materials that have a low toxicity.

In one aspect, a semiconductor nanocrystal includes a core including a first semiconductor material, the first semiconductor material being a III-V alloy. The III-V alloy can have the formula $M^1_i M^2_j E^1_x E^2_y$, wherein $M^1$ and $M^2$ are each independently a group III element; $E^1$ and $E^2$ are each independently a group V element; and i, j, x and y are each independently a non-negative number. The III-V alloy can have the formula $M^1 E^1_x E^2_{1-x}$, wherein $M^1$ is a group III element; $E^1$ and $E^2$ are each independently a group V element; i is 1; and x is a non-negative number ranging from 0 to 1. $M^1$ can be indium or gallium. $E^1$ can be nitrogen, phosphorus, arsenic, or antimony. $E^2$ can be nitrogen, phosphorus, arsenic, or antimony. The first semiconductor material can include indium or gallium. The first semiconductor material can include nitrogen, phosphorus, arsenic, or antimony.

The semiconductor nanocrystal can include an overcoating on a surface of the core, the overcoating including a second semiconductor material. The second semiconductor material can include a II-VI or a III-V semiconductor material. When the first semiconductor material includes indium and nitrogen, phosphorus, arsenic, or antimony, the second semiconductor material can include indium.

The semiconductor nanocrystal can include a second overcoating on a surface of the core, the overcoating including a third semiconductor material. When the second semiconductor material is a III-V semiconductor material, the third semiconductor material can be a II-VI semiconductor material.

In another aspect, a semiconductor nanocrystal includes a core including a first semiconductor material, a first overcoating including a second semiconductor material on a surface of the core, and a second overcoating including a third semiconductor material on a surface of the first overcoating.

The second semiconductor material can be selected to electronically passivate the core. The third semiconductor material can be selected to chemically stabilize the first overcoating. The semiconductor nanocrystal can include an outer layer including a ligand on a surface of the second overcoating. The core can include a III-V semiconductor material. The III-V semiconductor material can be an alloy. The first overcoating can include a III-V semiconductor material. The second overcoating can include a II-VI semiconductor material.

In another aspect, a series of semiconductor nanocrystals includes a first semiconductor nanocrystal including a first core, the first core including a III-V semiconductor material and having a diameter of less than 2.5 nm, and a second semiconductor nanocrystal including a second core, the second core including a III-V semiconductor material and having a diameter of less than 2.5 nm, wherein the diameter of the second core is distinct from the diameter of the first core. The core can have a diameter of less than 2.5 nm, such as less 2.3 nm, less than 2.0 nm, or less than 1.8 nm.

The series can include a third semiconductor nanocrystal including a third core, the third core including a III-V semiconductor material and having a diameter of less than 2 nm, wherein the diameter of the third core is distinct from the diameter of the first core and from the diameter of the second core. The first semiconductor nanocrystal can include an overcoating including a semiconductor material on a surface of the first core. Each semiconductor nanocrystal in the series can include an overcoating including a semiconductor material on a surface of a core. The overcoating of at least one semiconductor nanocrystal can include a II-VI semiconductor material. The II-VI semiconductor material can include ZnSe. The first core can include InAs. The first core, the second core, and the third core can each include InAs.

In another aspect, a semiconductor nanocrystal includes a core including a first semiconductor material, and an overcoating including a second semiconductor material on a surface of the core; wherein the second semiconductor material includes an alloy.

The first semiconductor material can include a III-V semiconductor material. The second semiconductor material can include a II-VI alloy. The II-VI alloy has the formula $M^1_i M^2_j E^1_x E^2_y$, where $M^1$ and $M^2$ are each independently a group II element; $E^1$ and $E^2$ are each independently a group VI element; and i, j, x and y are each independently a non-negative number. The II-VI alloy has the formula $M^1_i M^2_{1-i} E^1_x$, where $M^1$ and $M^2$ are each independently a group II element; $E^1$ is a group VI element; i is a non-negative number ranging from 0 to 1; and x is 1. The first semiconductor material can include indium or gallium.

In another aspect, a fluorescent particle includes a semiconductor nanocrystal including a III-V semiconductor material and a II-VI semiconductor material, and a ligand on a surface of the semiconductor nanocrystal, wherein the particle has a diameter no greater than 30 nm.

The particle can have a diameter between 10 and 20 nm. The particle can be water soluble. The semiconductor nanocrystal can include a core including the III-V semiconductor material and an overcoating on a surface of the core, the overcoating including the II-VI semiconductor material. The III-V semiconductor material can be a III-V alloy. The III-V alloy can include indium or gallium.

In another aspect, a method of making a semiconductor nanocrystal includes combining an M-containing precursor, an $E^1$-containing precursor, and an $E^2$-containing precursor and a solvent to form a mixture, wherein M is a group III element, $E^1$ is a group V element, and $E^2$ is a group V element, and heating the mixture to form a nanocrystal core.

The M-containing precursor can include indium or gallium. The $E^1$-containing precursor can include nitrogen, phosphorus, arsenic, or antimony. The $E^2$-containing precursor can include nitrogen, phosphorus, arsenic, or antimony.

The method can include forming a first overcoating on a surface of the core, the first overcoating including second semiconductor material. The second semiconductor material can include a II-VI or a III-V semiconductor material. The method can include forming a second overcoating including a third semiconductor material on a surface of the first overcoating. The second semiconductor material can include a III-V semiconductor material and the third semiconductor material can include a II-VI semiconductor material.

In another aspect, a method of forming a semiconductor nanocrystal includes forming a nanocrystal core including a first semiconductor material, forming a first overcoating including a second semiconductor material on a surface of the core, and forming a second overcoating including a third semiconductor material on a surface of the first overcoating.

The second semiconductor material can be selected to electronically passivate the core. The third semiconductor material can be selected to chemically stabilize the first overcoating. The core can include a III-V semiconductor material. The first overcoating can include a III-V semiconductor material. The second overcoating can include a II-VI semiconductor material.

In another aspect, a method of making a semiconductor nanocrystal includes selecting a emission wavelength, selecting a particle size, choosing a first semiconductor material based on the emission wavelength and the particle size, and forming a semiconductor nanocrystal including the chosen first semiconductor material. The selected emission wavelength can be a desired NIR wavelength, such as, for example between 700 nm and 1000 nm or between 800 and 900 nm. The chosen first semiconductor material can be a III-V semiconductor material. The desired particle size can be no greater than 30 nm. The desired particle size can be no greater than 10 nm.

Other features, objects, and advantages will be apparent from the description and drawings, and from the claims.

DETAILED DESCRIPTION

Figure 1A:
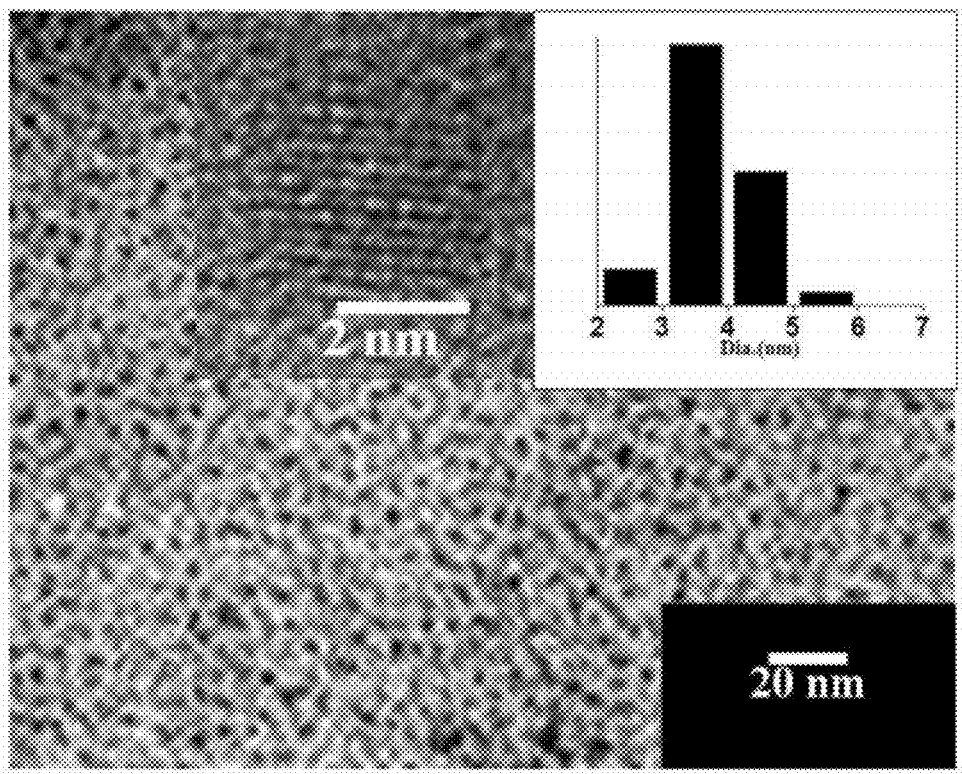
FIGS. 1A-1B are TEM images of semiconductor nanocrystals.

Fluorescent semiconductor nanocrystals are excellent contrast agents for biomedical assays and imaging. Much of the enthusiasm for using semiconductor nanocrystals in vivo stems from this property, since photon yield should be proportional to the integral of the broadband absorption. Tissue scatter and absorbance can sometimes offset increasing semiconductor nanocrystal absorption at bluer wavelengths, and counteract this potential advantage. When embedded in biological fluids and tissues, semiconductor nanocrystal excitation wavelengths can be quite constrained, and that excitation and emission wavelengths should be selected carefully based on the particular application. Near-infrared semiconductor nanocrystals optimized for imaging systems with white light excitation and a silicon CCD camera were produced and used to image the sentinel lymph node in real time. Emissive fluorescent semiconductor nanocrystal can be used as contrast agents optimized for specific biomedical applications. In particular, III-V semiconductor nanocrystals can have near-IR emission wavelengths. The sizes and compositions of the nanocrystals can be tuned to provide desired emission wavelengths.

Semiconductor nanocrystals are inorganic fluorophores that are currently being investigated for use as luminescent biological probes due to their nanometer dimensions and unique optical properties. Compared to conventional fluorophores and organic dyes, semiconductor nanocrystals have a number of attractive characteristics including high absorption cross-section, broadband absorption that is continuous and increases at wavelengths shorter than the band edge, relatively narrow and symmetric luminescence bands, simultaneous excitation of semiconductor nanocrystals with different emission wavelengths using a single excitation wavelength, and potentially high resistance to photo-degradation. Although the synthesis of semiconductor nanocrystals is performed in organic solvents, various surface chemistries can impart aqueous solubility and permit conjugation to biomolecules such as proteins, oligonucleotides, antibodies, and small molecule ligands. Such "targeted" semiconductor nanocrystals have been reported as contrast agents for nucleic acid hybridization, cellular imaging, immunoassays, and recently, tissue-specific homing in vivo. See, for example, Bruchez et al., *Science* 281:2013-2016 (1998); Chan and Nie, Science 281:2016-2018 (1998); Mattoussi et al., *J. Am. Chem. Soc.* 122:12142-12150 (2000); Klarreich, *Nature* 413: 450-452 (2001); Chan et al., *Curr Opin Biotechnol* 13:40-46 (2002); Wu et al., *Nature Biotechnol.*, 21, 41-26 (2003); Dubertret et al., *Science* 298:1759-1762 (2002); Pathak et al., *J. Am. Chem. Soc.* 123:4103-4104 (2001); Gerion et al., *J. Am. Chem. Soc.* 124:7070-7074 (2002); Goldman et al., *J. Am. Chem. Soc.* 124:6378-6382 (2002); Goldman et al., *Anal. Chem.* 74:841-847 (2002); Rosenthal et al., *J. of the Am. Chem. Soc.* 124:4586-4594 (2002); Akerman et al., *Proc. Natl. Acad. Sci. USA* 99:12617-12621 (2002); and Jaiswal et al., *Nature Biotechnol.*, 21 47-51 (2003), each of which is incorporated by reference in its entirety.

Another potential application of semiconductor nanocrystals is as fluorescent contrast agents for biomedical imaging. However, in vivo applications, such as reflectance fluorescence imaging, require deep photon penetration into and out of tissue. In living tissue, total photon attenuation is the sum of attenuance due to absorbance and scatter. Scatter describes the deviation of a photon from the parallel axis of its path, and can occur when the tissue inhomogeneity is small relative to wavelength (Rayleigh-type scatter), or roughly on the order of wavelength (Mie-type scatter). See, for example, Zaheer et al., *Nature Biotechnol.* 19:1148-1154 (2001); Nakayama et al., "Functional near-infrared fluorescence imaging for cardiac surgery and targeted gene therapy," *Molecular Imaging* (2002); Cheong et al., *IEEE J. Quantum Electronics* 26:2166-2195 (1990); and Cerussi et al., *Acad. Radiol.* 8:211-218 (2001), each of which is incorporated by reference in its entirety.

Given the relatively low absorbance and scatter of living tissue in the near-infrared (NIR; 700 nm to 1000 nm) region of the spectrum, considerable attention has focused on NIR fluorescence contrast agents. For example, conventional NIR fluorophores with peak emission between 700 nm and 800 nm have been used for in vivo imaging of protease activity, somatostatin receptors, sites of hydroxylapatite deposition, and myocardial vascularity, to name a few. A mathematical model was used to predict how various tissue characteristics will affect semiconductor nanocrystal performance in vivo, and the model was used to select optimal semiconductor nanocrystal excitation and emission wavelengths for various imaging applications. See, for example, Zaheer et al., *Nature Biotechnol.* 19:1148-1154 (2001); Nakayama et al., "Functional near-infrared fluorescence imaging for cardiac surgery and targeted gene therapy," *Molecular Imaging* (2002); Weissleder, *Nature Biotechnol.* 19:316-7 (2001); Weissleder et al., *Nature Biotechnol.* 17:375-378 (1999); Becker et al., *Nature Biotechnol.* 19:327-31 (2001); Bugaj et al., *J. Biomed. Opt.* 6:122-33 (2001); Gardner et al., *Lasers Surg. Med.* 18:129-38 (1996); and U.S. patent application Ser. Nos. 10/772,424 and 10/772,425 each of which is incorporated by reference in its entirety.

The method of manufacturing a nanocrystal is a colloidal growth process. See, for example, U.S. Pat. Nos. 6,322,901 and 6,576,291, each of which is incorporated by reference in its entirety. Colloidal growth occurs by rapidly injecting an M-containing compound and an X donor into a hot solvent. The solvent can include a coordinating solvent, a non-coordinating solvent, or a mixture of coordinating and non-coordinating solvents. The non-coordinating solvent can be a high-boiling point organic solvent, such as, for example, 1-octadecene. The coordinating solvent can include a phosphine or a phosphine oxide. The M-containing compound can be a metal, an M-containing salt, or an M-containing organometallic compound. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M-containing compound or X donor, the growth period can be shortened.

An M-containing salt is a non-organometallic compound, e.g., a compound free of metal-carbon bonds. M is cadmium, zinc, magnesium, mercury, aluminum, gallium, indium or thallium. The M-containing salt can be a metal halide, metal carboxylate, metal carbonate, metal hydroxide, metal oxide, or metal diketonate, such as a metal acetylacetonate. The M-containing salt is less expensive and safer to use than organometallic compounds, such as metal alkyls. For example, the M-containing salts are stable in air, whereas metal alkyls are generally unstable in air. M-containing salts such as 2,4-pentanedionate (i.e., acetylacetonate (acac)), halide, carboxylate, hydroxide, or carbonate salts are stable in air and allow nanocrystals to be manufactured under less rigorous conditions than corresponding metal alkyls.

Suitable M-containing salts include cadmium acetylacetonate, cadmium iodide, cadmium bromide, cadmium hydroxide, cadmium carbonate, cadmium acetate, cadmium oxide, zinc acetylacetonate, zinc iodide, zinc bromide, zinc hydroxide, zinc carbonate, zinc acetate, zinc oxide, magnesium acetylacetonate, magnesium iodide, magnesium bromide, magnesium hydroxide, magnesium carbonate, magnesium acetate, magnesium oxide, mercury acetylacetonate, mercury iodide, mercury bromide, mercury hydroxide, mercury carbonate, mercury acetate, aluminum acetylacetonate, aluminum iodide, aluminum bromide, aluminum hydroxide, aluminum carbonate, aluminum acetate, gallium acetylacetonate, gallium iodide, gallium bromide, gallium hydroxide, gallium carbonate, gallium acetate, indium acetylacetonate, indium iodide, indium bromide, indium hydroxide, indium carbonate, indium acetate, thallium acetylacetonate, thallium iodide, thallium bromide, thallium hydroxide, thallium carbonate, or thallium acetate.

Prior to combining the M-containing salt with the X donor, the M-containing salt can be contacted with a coordinating solvent to form an M-containing precursor. Typical coordinating solvents include alkyl phosphines, alkyl phosphine oxides, alkyl phosphonic acids, or alkyl phosphinic acids, however, other coordinating solvents, such as pyridines, furans, and amines may also be suitable for nanocrystal production. Examples of suitable coordinating solvents include pyridine, tri-n-octyl phosphine (TOP) and tri-n-octyl phosphine oxide (TOPO). Technical grade TOPO can be used. The coordinating solvent can include a 1,2-diol, an aldehyde, or a carboxylic acid. The 1,2-diol, aldehyde, or carboxylic acid can facilitate reaction between the M-containing salt and the X donor and improve the growth process and the quality of the nanocrystal obtained in the process. The 1,2-diol, aldehyde, or carboxylic acid can be a $C_6$-$C_{20}$ 1,2-diol, a $C_6$-$C_{20}$ aldehyde, or a $C_6$-$C_{20}$ carboxylic acid. A suitable 1,2-diol is 1,2- hexadecanediol, a suitable aldehyde is dodecanal, and a suitable carboxylic acid is oleic acid.

The X donor is a compound capable of reacting with the M-containing salt to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, elemental sulfur, bis(trimethylsilyl) selenide ($(TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ($(TMS)_2Te$), sulfur, bis(trimethylsilyl)sulfide ($(TMS)_2S$), a trialkyl phosphine sulfide such as (tri-n-octylphosphine)sulfide (TOPS), tris(dimethylamino)arsine, an ammonium salt such as an ammonium halide (e.g., $NH_4Cl$), tris(trimethylsilyl)phosphide ($(TMS)_3P$), tris(trimethylsilyl)arsenide ($(TMS)_3As$), or tris(trimethylsilyl)antimonide ($(TMS)_3Sb$). In certain embodiments, the M donor and the X donor can be moieties within the same molecule.

The nanocrystal manufactured from an M-containing salt can grow in a controlled manner when the coordinating solvent includes an amine. The amine in the coordinating solvent contributes to the quality of the nanocrystal obtained from the M-containing salt and X donor. Preferably, the coordinating solvent is a mixture of the amine and an alkyl phosphine oxide in a mole ratio of 10:90, more preferably 30:70 and most preferably 50:50. The combined solvent can decrease size dispersion and can improve photoluminescence quantum yield of the nanocrystal. The preferred amine is a primary alkyl amine or a primary alkenyl amine, such as a $C_2$-$C_{20}$ alkyl amine, a $C_2$-$C_{20}$ alkenyl amine, preferably a $C_8$-$C_{18}$ alkyl amine or a $C_8$-$C_{18}$ alkenyl amine. For example, suitable amines for combining with tri-octylphosphine oxide (TOPO) include 1-hexadecylamine, or oleylamine. When the 1,2-diol or aldehyde and the amine are used in combination with the M-containing salt to form a population of nanocrystals, the photoluminescence quantum efficiency and the distribution of nanocrystal sizes are improved in comparison to nanocrystals manufactured without the 1,2-diol or aldehyde or the amine.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, both CdSe and CdS can be tuned in the visible region and InAs can be tuned in the infrared region.

A population of nanocrystals can have a narrow size distribution. The population can be monodisperse and can exhibit less than a 15% rms deviation in diameter of the nanocrystals, preferably less than 10%, more preferably less than 5%. Spectral emissions in a narrow range of between 10 and 100 nm full width at half max (FWHM) can be observed. Semiconductor nanocrystals can have emission quantum efficiencies of greater than 2%, 5%, 10%, 20%, 40%, 60%, 70%, or 80%.

The semiconductor forming the core of the nanocrystal can include Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnO, ZnS, ZnSe, ZnTe, CdO, CdS, CdSe, CdTe, MgO, MgS, MgSe, MgTe, HgO, HgS, HgSe, HgTe, AN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

The quantum efficiency of emission from nanocrystals having a core of a first semiconductor material be enhanced by applying an overcoating of a second semiconductor material such that the conduction band of the second semiconductor material is of higher energy than that of the first semiconductor material, and the valence band of the second semiconductor material is of lower energy than that of the first semiconductor material. As a result, carriers, i.e., electrons and holes, are confined in the core of the nanocrystal. The core can have an overcoating on a surface of the core. The overcoating can be a semiconductor material having a composition different from the composition of the core, and can have a band gap greater than the band gap of the core. The overcoat of a semiconductor material on a surface of the nanocrystal can include a Group II-VI compound, a Group II-V compound, a Group III-VI compound, a Group III-V compound, a Group IV-VI compound, a Group I-III-VI compound, a Group II-IV-VI compound, or a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

A nanocrystal can include a second overcoating. The second overcoating can be a semiconductor material having a composition different from the composition of the core or first overcoating. The second overcoating can chemically stabilize the core and first overcoating. The second overcoat of a semiconductor material can include a Group II-VI compound, a Group II-V compound, a Group III-VI compound, a Group III-V compound, a Group IV-VI compound, a Group compound, a Group II-IV-VI compound, or a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

An alloy can have the formula $M^1_i M^2_j E^1_x E^2_y$. $M^2$ and $M^2$ can each independently be a group II, group III, or group IV element. $E^1$ and $E^2$ each independently can be a group IV, group V, or group VI element. For example, $M^1$ and $M^2$ can each independently be magnesium, zinc, cadmium, mercury, aluminum, gallium, indium, thallium, silicon, germanium, tin, or lead; and $E^1$ and $E^2$ each independently can be silicon, germanium, tin, lead, nitrogen, phosphorus, arsenic, antimony, oxygen, sulfur, selenium, or tellurium.

In general, the values of i, j, x, and y are non-negative. In some instances, the value of i, j, x, or y can be an integer. For example, an alloy can have the formula $M^1 E^1_x E^2_y$. In this formula, the value of i is 1 and the value of j is zero (alternatively, and $M^1$ and $M^2$ are identical). The sum of i and j can be an integer, and the sum of x and y can be an integer. For example, if the sum of x and y is 1, the preceding formula can be expressed as $M^1 E^1_x E^2_{1-x}$. In another example, an alloy can have the formula $M^1_i M^2_{1-i} E^1$.

When $M^1$ and $M^2$ are both group III elements, and $E^1$ and $E^2$ are both group V elements, the alloy can be referred to as a group III-V alloy. Likewise, a group II-VI alloy refers to an alloy where $M^1$ and $M^2$ are both group II elements, and $E^1$ and $E^2$ are both group VI elements.

The nanocrystal can be a semiconductor nanocrystal heterostructure, which has a core of a first semiconductor material surrounded by an overcoating of a second semiconductor material. In the heterostructure, the first semiconductor material and second semiconductor material are selected so that, upon excitation, one carrier (i.e., the electron or hole) is substantially confined to the core and the other carrier is substantially confined to the overcoating. See, for example, U.S. Ser. No. 10/638,546, filed Aug. 12, 2003, and U.S. Ser. No. 60/402,726, filed Aug. 13, 2002, each of which is incorporated by reference in its entirety.

The outer surface of the nanocrystal can include a layer of compounds derived from the coordinating agent used during the growth process. The surface can be modified by repeated exposure to an excess of a competing coordinating group to form an overlayer. For example, a dispersion of the capped nanocrystal can be treated with a coordinating organic compound, such as pyridine, to produce crystals which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. The overlayer can include a water solubilizing compound, i.e., one that provides a hydrophilic moiety that tends to render the nanocrystal soluble in aqueous solvents. Examples of water soluble nanocrystals are described in, for example, U.S. Pat. Nos. 6,251,303 and 6,319,426, each of which is incorporated by reference in its entirety.

Monodentate alkyl phosphines (and phosphine oxides, the term phosphine below will refer to both) can passivate nanocrystals efficiently. When nanocrystals with conventional monodentate ligands are diluted or embedded in a non-passivating environment (i.e. one where no excess ligands are present), they tend to lose their high luminescence and their initial chemical inertness. Typical are an abrupt decay of luminescence, aggregation, and/or phase separation. In order to overcome these limitations, polydentate ligands can be used, such as a family of polydentate oligomerized phosphine ligands. The polydentate ligands show a high affinity between ligand and nanocrystal surface. In other words, they are stronger ligands, as is expected from the chelate effect of their polydentate characteristics.

Oligomeric phosphines have more than one binding site to the nanocrystal surface, which ensures their high affinity to the nanocrystal surface. See, for example, U.S. patent application Ser. No. 10/641,292, filed Aug. 15, 2003, and U.S. patent application. No. 60/403,367, filed Aug. 15, 2002, each of which is incorporated by reference in its entirety. The oligomeric phosphine can be formed from a monomeric, polyfunctional phosphine, such as, for example, trishydroxypropylphosphine, and a polyfunctional oligomerization reagent, such as, for example, a diisocyanate. The oligomeric phosphine can be contacted with an isocyanate of formula R'-L-NCO, wherein L is $C_2$-$C_{24}$ alkylene, and R' has the formula

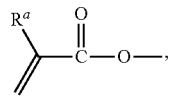

R' has the formula

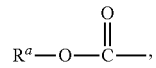

or R' is hydrogen, wherein $R^a$ is hydrogen or $C_1$-$C_4$ alkyl.

Alkyl is a branched or unbranched saturated hydrocarbon group of 1 to 100 carbon atoms, preferably 1 to 30 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. Optionally, an alkyl can contain 1 to 6 linkages selected from the group consisting of —O—, —S—, -M- and —NR— where R is hydrogen, or $C_1$-$C_8$ alkyl or lower alkenyl.

An overcoating process is described, for example, in U.S. Pat. No. 6,322,901, incorporated herein by reference in its entirety. By adjusting the temperature of the reaction mixture during overcoating and monitoring the absorption spectrum of the core, overcoated materials having high emission quantum efficiencies and narrow size distributions can be obtained. Alternatively, an overcoating can be formed by exposing a core nanocrystal having a first composition and first average diameter to a population of nanocrystals having a second composition and a second average diameter smaller than the first average diameter.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter, a population having an average nanocrystal diameter of less than 150 Å can be obtained. A population of nanocrystals can have an average diameter of 15 Å to 125 Å.

The particle size distribution can be further refined by size selective precipitation with a poor solvent for the nanocrystals, such as methanol/butanol as described in U.S. Pat. No. 6,322,901, incorporated herein by reference in its entirety. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystals in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

Transmission electron microscopy (TEM) can provide information about the size, shape, and distribution of the nanocrystal population. Powder X-ray diffraction (XRD) patterns can provided the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

Semiconductor nanocrystals having a ((core)/shell)/shell structure can be prepared. The first shell can electronically passivate the core. The nanocrystal surface can be passivated by reaction of the surface atoms of the nanocrystal with a passivating material, so as to eliminate forbidden energy levels. Such passivation produces an atomically abrupt increase in the chemical potential at the interface of the semiconductor and passivating material. Nanocrystals having a passivating material can have a higher quantum yield than those lacking the passivating material. The passivating material can be, for example, an organic ligand (such as TOP or TOPO), or an inorganic material, such as a semiconductor material. See, for example, U.S. Pat. No. 6,322,901, which is incorporated by reference in its entirety. The second shell can chemically stabilize the core and the first shell. The core can be an alloy core. When the core and the first shell include III-V semiconductor materials, the second shell can include a II-VI semiconductor material.

Semiconductor nanocrystals can be prepared with an alloy core of the formula $M^1E^1_xE^2_{1-x}$. The alloy can be a III-V alloy. $M^1$ can be indium or gallium. Each of $E^1$ and $E^2$ can be a pnictide, such as, for example, nitrogen, phosphorus, arsenic, or antimony. The alloy core can be coated with a primary shell of a second semiconductor material. The primary shell can be coated with a secondary shell including a third semiconductor material. The sizes and compositions of the core and the shell(s) can be selected such that the semiconductor nanocrystal emits light in the range of 700-1000 nm, or 800-900 nm. A semiconductor nanocrystal can be prepared with a shell having the formula $M^1E^1_xE^2_{1-x}$; or the formula $M^1_iM^2_{1-i}E^1$.

Semiconductor nanocrystals including an alloy core of the formula $InAs_xP_{1-x}$, an intermediate shell of InP, and an outer shell of ZnSe can be prepared. When rendered water soluble with oligomeric phosphine ligands, the semiconductor nanocrystals emitted in the desirable 800-900 nm range with a quantum yield (QY) sufficient for biomedical imaging applications. The semiconductor nanocrystals can be prepared with a hydrodynamic diameter of less than 30 nm, such as between 10 and 30 nm, between 10 and 20 nm or between 10 and 15 nm. The hydrodynamic diameter of the nanocrystals can be optimized for sentinel lymph node (SLN) mapping. The alloy core can simultaneously satisfy the size and emission wavelength requirement for SLN mapping. The semiconductor nanocrystals can be designed to maximize the volume of the absorbing inorganic core, and hence to maximize its absorption cross-section.

InAs semiconductor nanocrystals can have emission wavelengths longer than 800 nm. See, for example, H. Uchida, et al., *Chem. Mater.* 1993, 5, 716; A. A. Guzelian, et al, *Appl. Phys. Lett.* 1996, 69, 1432; X. Peng, et al., *J. Am. Chem. Soc.* 1998, 120, 5343; Y.-W. Cao, and U. Banin, *Angew. Chem.* 1999, 111, 3913; *Angew. Chem. Int. Ed.* 1999, 38, 3692; Y. Cao, and U. Banin, *J. Am. Chem. Soc.* 2000, 122, 9692; M. Green, et al., *J. Mater. Chem.* 2000, 10, 1939; J. Lu, et al., *Inorg. Chem.* 2004, 43, 4543; and D. Battaglia, and X. Peng, *Nano Lett.* 2002, 2, 1027, each of which is incorporated by reference in its entirety.

A size series of small InAs cores (less than 2.0 nm in diameter) can be synthesized. The cores can be coated with a second, higher band-gap semiconductor shell. By varying the initial core size, and the shell thickness and composition, a wide tunability of the final emission wavelength was obtained, ranging from 750 to 920 nm. In addition, these materials can be water solubilized, and exhibit stable emission in water. Quantum yields for (InAs)/ZnSe (core)/shell semiconductor nanocrystals were 7-10% in hexane and 6-9% in water.

EXAMPLES

A III-V alloy semiconductor nanocrystal core can be prepared according to the method described in Peng, X.; Battaglia, D. *Nano Lett.* 2002, 2, 1027, which is incorporated by reference in its entirety. Indium acetate (In(OAc)$_3$), tris(trimethylsilyl)phosphine ((TMS)$_3$P), and tris(trimethylsilyl)arsine ((TMS)$_3$As) were used as indium, phosphorus, and arsenic precursors, respectively. The phosphine and arsine precursors were injected into a solution of In(OAc)$_3$ and oleic acid in 1-octadecene.

To prepare nanocrystal cores with the formula $InAs_xP_{1-x}$, where x is 0.66, 0.044 g (0.15 mmol) of indium acetate was mixed with 0.127 mg (0.45 mmol) of oleic acid and 8 mL of 1-octadecene and degassed at 100° C. for 1 hour. The solution was purged with nitrogen, and then heated to 300° C. under nitrogen. Then, 0.0125 g (0.05 mmol) of (TMS)$_3$P and 0.0147 g (0.05 mmol) of (TMS)$_3$As was dissolved in 2 mL of octadecene in a glovebox, and injected into the hot reaction flask. After injection, the temperature of the reaction was lowered to 270° C. and maintained there for 3 hours. The solution was cooled to room temperature and the semiconductor nanocrystals were precipitated with ethanol.

Nanocrystal cores having the formula $InAs_{0.33}P_{0.66}$ were prepared by using the same procedure, except using 0.018 g (0.075 mmol) of (TMS)$_3$P and 0.007 g (0.025 mmol) of (TMS)$_3$As. Cores having the formula $InAs_{0.82}P_{0.18}$ were likewise prepared by the same procedure except using 0.006 g (0.025 mmol) of (TMS)$_3$P and 0.022 g (0.075 mmol) of (TMS)$_3$As.

Figure 1B:
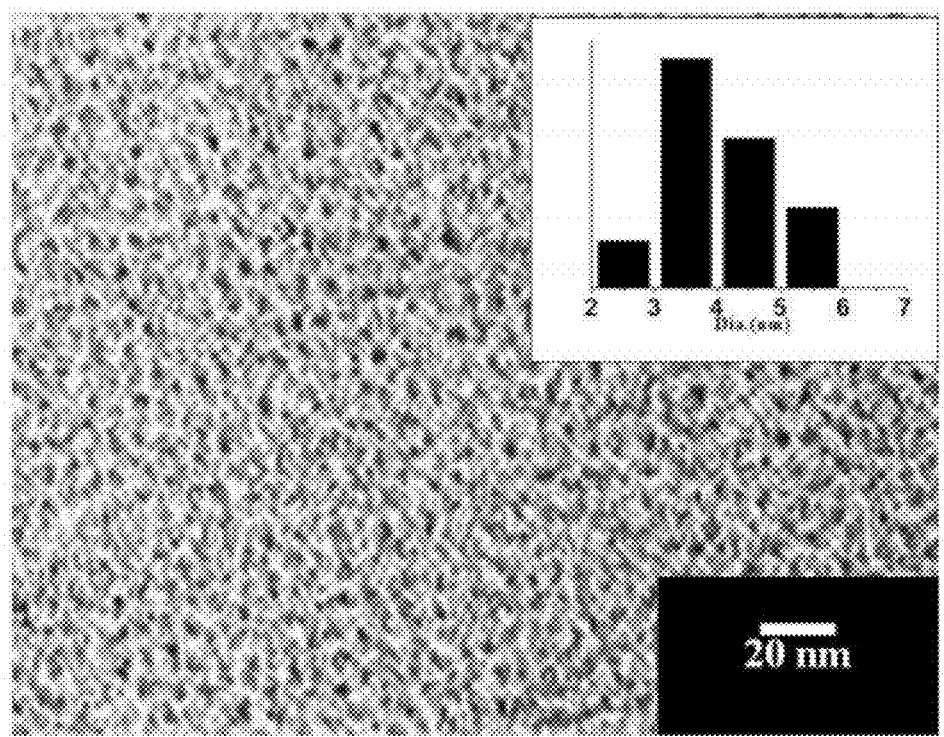

Elemental analyses by wavelength dispersive X-ray spectroscopy (WDS) show that injected As/P ratios of 75/25, 50/50, and 25/75 resulted in nanocrystals having As/P ratios of 82/18, 66/33, and 33/66, respectively, indicating that the arsine precursor is more reactive than the phosphine precursor. Microscope (TEM) images showed that the particles are crystalline, with sizes that were independent of the composition. FIG. 1A shows a TEM image of $InAs_{0.66}P_{0.33}$ nanocrystals, of a single nanocrystal at greater magnification (inset) and a histogram of nanocrystal diameters (second inset). FIG. 1B shows a TEM image of and $InAs_{0.82}P_{0.18}$ nanocrystals and a histogram of nanocrystal diameters (inset).

Figure 1C:
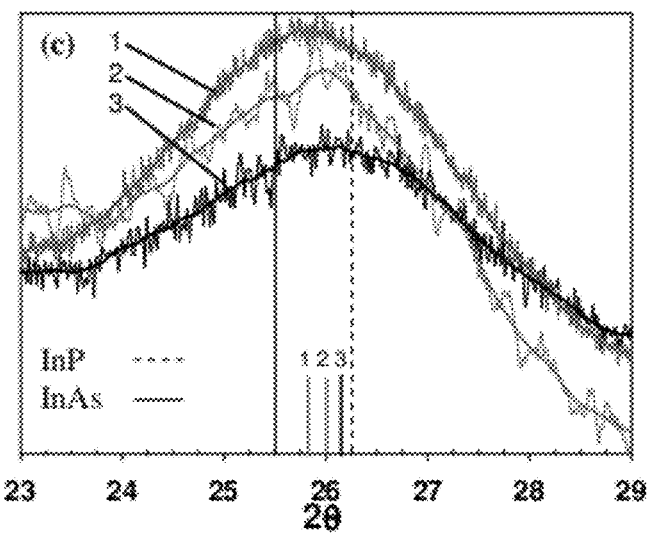
FIGS. 1C-1D are graphs depicting X-ray diffraction data for semiconductor nanocrystals.
Figure 1D:
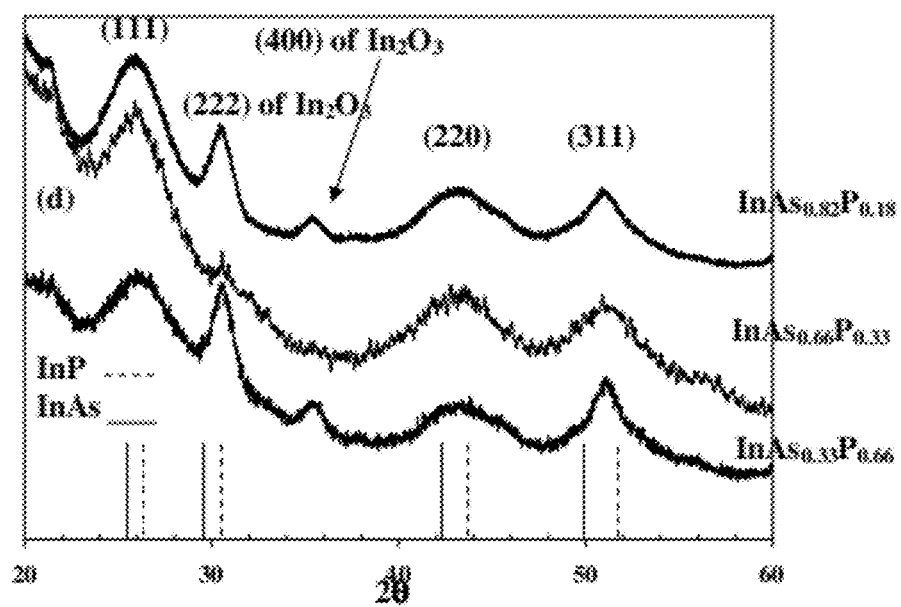
Figure 1E:
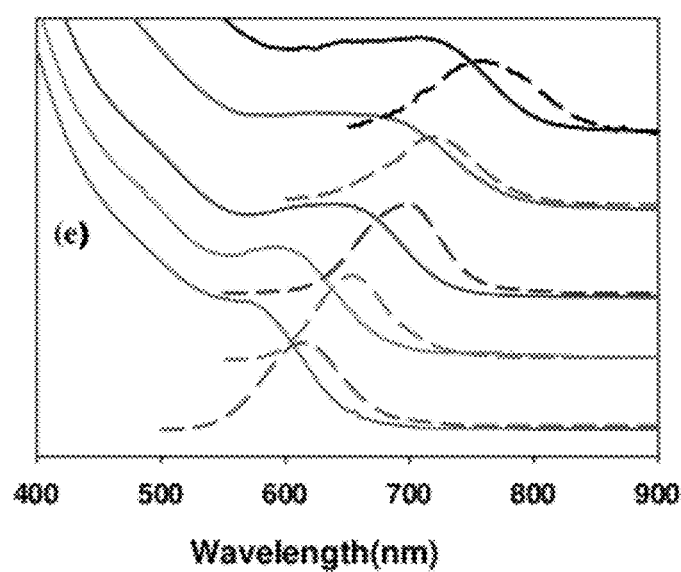
FIG. 1E is a graph depicting absorbance and fluorescence spectra of semiconductor nanocrystals.

FIG. 1C shows powder X-ray diffraction (XRD) patterns and fitting curves of the (111) plane; $InAs_{0.82}P_{0.18}$ (trace labelled '1'), $InAs_{0.66}P_{0.33}$ (trace labelled '2'), and $InAs_{0.33}P_{0.66}$, (trace labelled '3'); labelled tick lines represent the mean center of peaks. The powder (XRD) patterns in FIG. 1D exhibited three prominent peaks, indexed to the scattering from (111), (220), and (311) planes of the zinc blende structure of the ternary alloyed nanocrystals over all compositions. These alloys were easily oxidized to $In_2O_3$. The presence of $In_2O_3$ was indicated by the (222) reflection at 31°, and (400) reflection at 35°). The continuous peak shift of the (111) plane with composition was consistent with a homogeneous alloy, according to Vegard's law (FIG. 1C; see, for example Furdyna, J. K. *J. Appl. Phys.* 1998, 64, R29, which is incorporated by reference in its entirety). The absorption and fluorescence spectra of alloyed nanocrystals with different arsenic fractions are shown in FIG. 1E. In FIG. 1E, absorbance spectra are shown as solid lines and the corresponding photoluminescence spectra as dashed lines. Spectra of InP, $InAs_{0.33}P_{0.66}$, $InAs_{0.66}P_{0.33}$, $InAs_{0.82}P_{0.88}$, and InAs nanocrystals were recorded and are shown from bottom to top in FIG. 1E. For a constant nanocrystal size, varying the relative amount of arsenic and phosphorus in the nanocrystals tuned the fluorescence emission wavelength from 600 to 800 nm. Measured values of quantum yield (QY) for $InAs_xP_{1-x}$ nanocrystals were 1-2%.

$InAs_xP_{1-x}$ nanocrystals were overcoated with a shell of InP to increase size and QY. This shell was grown by injecting a mixture of $In(OAc)_3$ and $(TMS)_3P$ to the solution of $InAs_xP_{1-x}$ nanocrystals at 140° C. This temperature was sufficiently low to avoid nucleation, which could lead to formation of new InP semiconductor nanocrystals, rather than an overcoating of cores. The temperature was then increased to 180° C. (see supporting information). Specifically, the previous $InAs_{0.82}P_{0.18}$ solution was cooled to 140° C., then 0.030 g (0.10 mmol) of indium acetate and 0.018 g (0.075 mmol) of $(TMS)_3P$ was mixed in 2 mL of 1-octadecene in a glovebox, and injected into the solution. The temperature was increased to 180° C., and maintained there for 1 hour. The same procedure was used for a third injection.

Figure 2A:
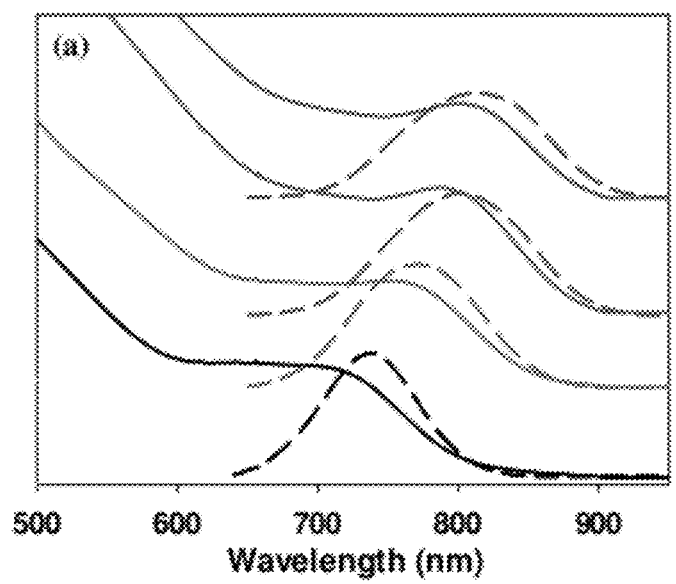
FIGS. 2A-2B are graphs depicting absorbance and fluorescence spectra of semiconductor nanocrystals.

Secondary and tertiary injections of In and P precursors to a solution of $InAs_{0.82}P_{0.18}$ nanocrystals (having a 738 nm peak emission wavelength) resulted in core-shell particles with emission at 765 nm and 801 nm respectively, and a three-fold increase of the QY. FIG. 2A shows, from bottom to top, absorbance spectra (solid lines) and corresponding photoluminescence spectra (dashed lines) of $InAs_{0.82}P_{0.18}$ nanocrystals, $InAs_{0.82}P_{0.18}$ overcoated with one InP injection, $InAs_{0.82}P_{0.18}$ overcoated with two InP injections, and $InAs_{0.82}P_{0.18}$ overcoated with two InP injections further overcoated with a ZnSe shell.

Figure 2B:
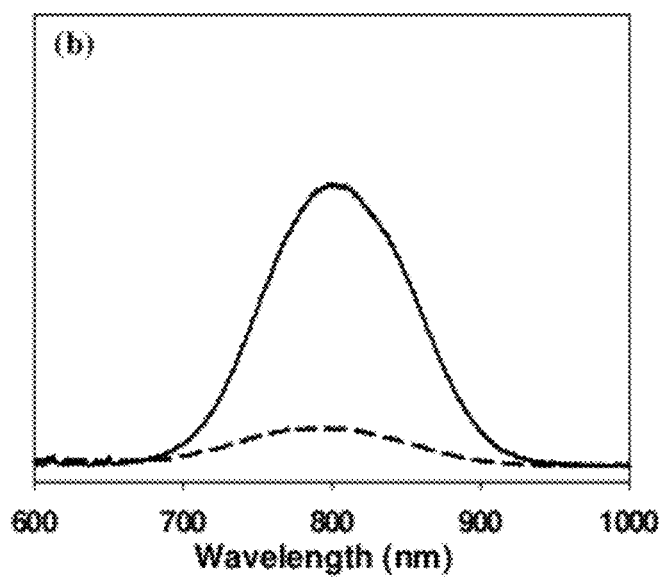

If an InAs shell was grown instead, the fluorescence can be quenched because the bandgap of the core was larger than that of shell, resulting in an inverse Type-I structure. Cap exchange with oligomeric phosphine ligands was performed to impart water solubility to the nanocrystals (see, for example, Kim, S.; Bawendi, M. G. *J. Am. Chem. Soc.* 2003. 125, 14652; and U.S. patent application Ser. No. 10/641,292, which is incorporated by reference in its entirety). This, however, resulted in weak fluorescence (QY decreased by 90%). See FIG. 2B, which shows photoluminescence spectra of $InAs_{0.82}P_{0.18}$ core/InP shell in organic solvent (solid line) and water (dashed line). This decrease in QY can be due to the oxidation of the III-V shell material.

Figure 2C:
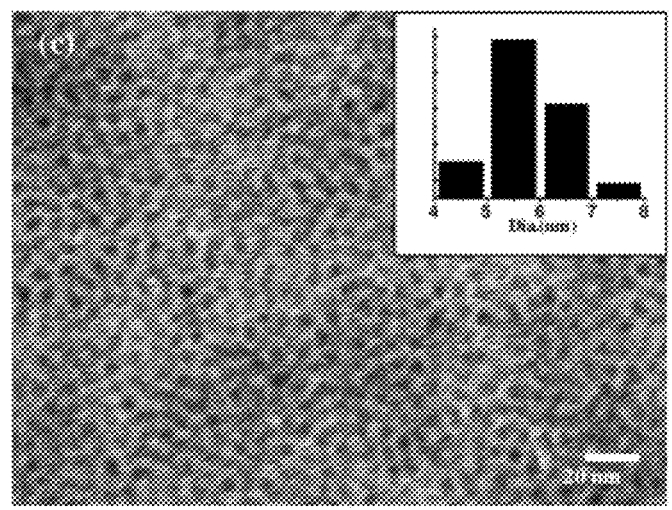
FIG. 2C is a TEM image of semiconductor nanocrystals.
Figure 2D:
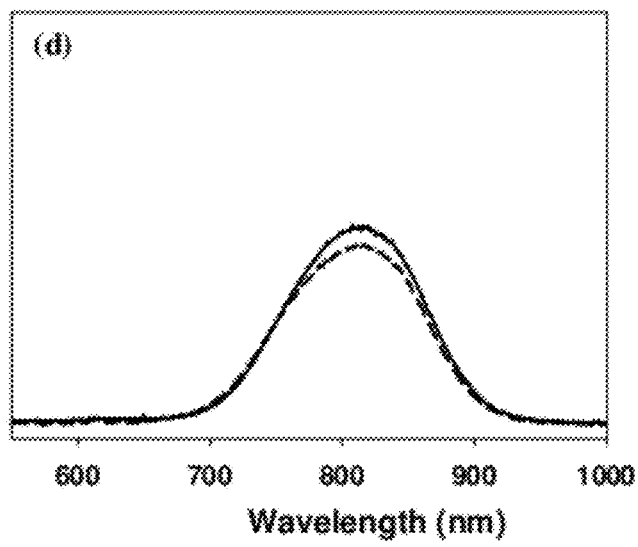
FIG. 2D is a graph depicting fluorescence spectra of semiconductor nanocrystals.

To stabilize the dots for dispersal in an aqueous environment, the overcoated nanocrystals were further overcoated with a secondary shell of ZnSe. Diethylzinc (0.012 g, 0.10 mmol) and 0.1 mL (0.10 mmol) of 1 M TOPSe was mixed with 2 mL of TOP in a glovebox, and added to the solution of $(InAs_xP_{1-x})/InP$ (core)/shell nanocrystals dropwise over 1 hour at 200° C. This resulted in an additional red shift of 10-15 nm in the peak emission wavelength. FIG. 2A shows absorbance and photoluminescence spectra of such a sample: ((core)/shell)/shell $((InAs_xP_{1-x})/InP)/ZnSe$ nanocrystals emitting at 815 nm with a QY of 3.5% (double the QY of the uncoated core nanocrystals) and FIG. 2C shows a TEM micrograph from this same sample. The QY was large enough for biomedical imaging experiment and competitive with the type II heterostructure nanocrystals (see, for example, Kim, S.; et al., *Nature Biotechnology* 2004, 22, 93; and U.S. patent application Ser. No. 10/638,546, each of which is incorporated by reference in its entirety) because the absorption spectrum of these type I nanocrystals has a peak in the important NIR region instead of the characteristic tail of the type II nanocrystals. Cap exchange with oligomeric phosphines and transfer to water did not have an appreciable effect on the QY (see FIG. 2d, showing photoluminescence of $((InAs_{0.82}P_{0.18})/InP)/ZnSe$ ((core)/shell)/shell nanocrystals in organic solvent (solid line) and water (dashed line)).

Figures 3A, 3B:
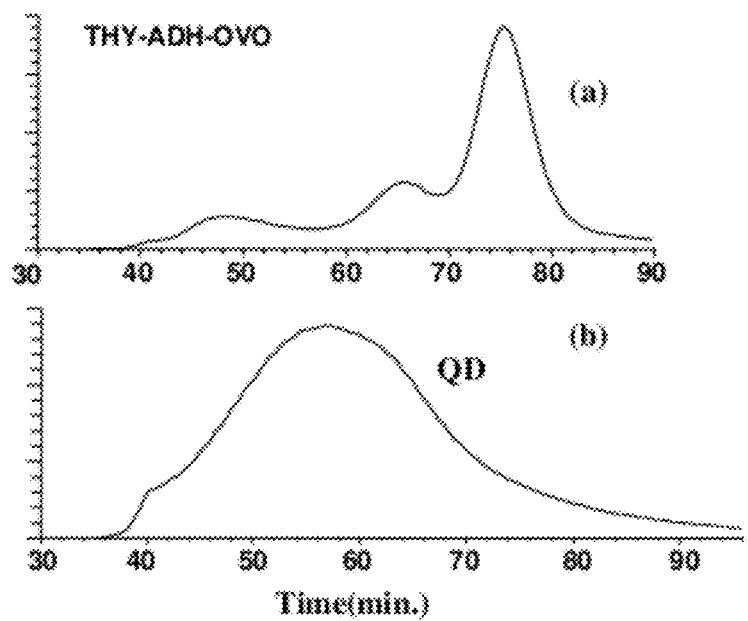
FIGS. 3A-3B are graphs depicting gel filtration chromatography data.
Figure 3C:
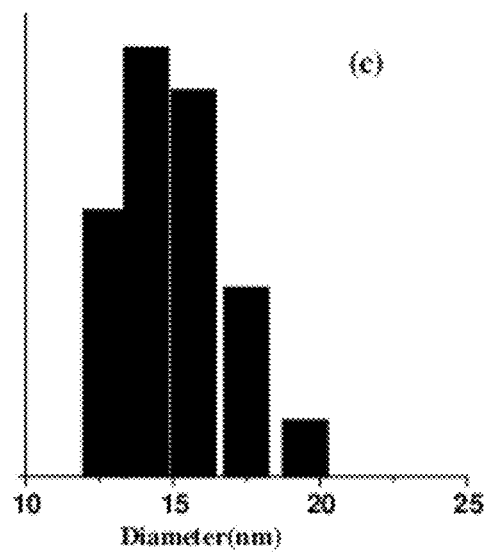
FIG. 3C is a graph depicting quasi-elastic light scattering data.

The hydrodynamic diameter of water-soluble nanocrystals can be important for biological imaging, such as, for example, SLN mapping. Particles with a hydrodynamic diameter <5 nm can partition into the bloodstream; particles between 5 and 10 nm in size can flow through the SLN and into subsequent nodes in the chain; and particles >300 nm do not leave the injection site. See, for example, Uren, R. F.; and Hoefnagel, C. A. In *Textbook of Melanoma*; Thompson, J. F., Morton, D. M., Kroon, B. B. R., Eds.; Martin Dunitz: London, 2003, which is incorporated by reference in its entirety. As measured by gel filtration chromatography, $((InAs_xP_{1-x})/InP)/ZnSe$ ((core)/shell)/shell nanocrystals stabilized with oligomeric phosphines ran equivalently to a protein of 230 kDa, corresponding to a hydrodynamic diameter of approximately 12 nm. See FIGS. 3A-B, which show gel filtration chromatography results for protein standards (FIG. 3A) thyroglobulin (669 kDa, 48.3 minutes), alcohol dehydrogenase (150 kDa, 65.7 minutes), and ovalbumin (44 kDa, 75.4 minutes), and in FIG. 3B, nanocrystals (57.2 minutes, equivalent to a 230 kDa protein) in PBS, pH 7.0. The hydrodynamic diameter measured in PBS at pH 7.0 by quasi-elastic light scattering (QELS) was 15 nm (FIG. 3C).

Figure 4:
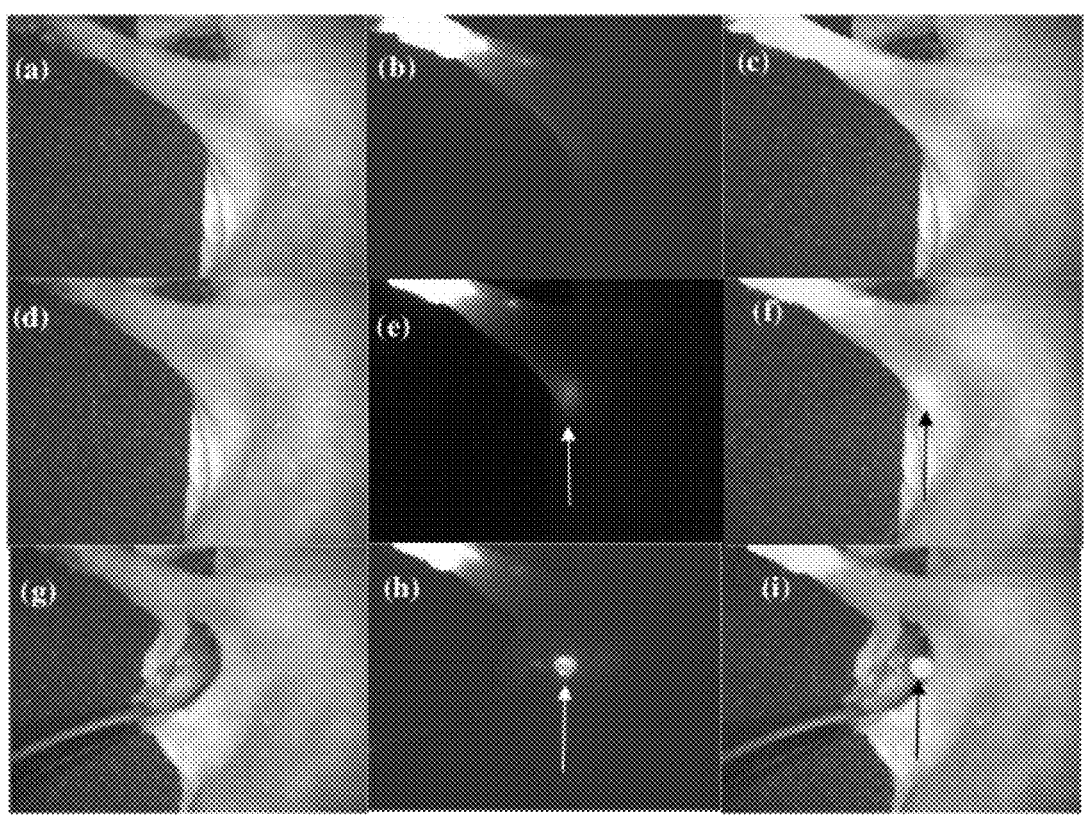
FIG. 4 is a series of video images depicting sentinel lymph node mapping.

An intraoperative video imaging system that superimposes NIR fluorescence on a display of visible light anatomy (see, for example, Kim, S.; et al., *Nature Biotechnology* 2004, 22, 93, incorporated by reference in its entirety) was used to test the nanocrystals in SLN mapping. Following intradermal injection into the leg of a mouse, the nanocrystals entered the lymphatics and migrated within minutes to the sentinel node, which was easily detected through the skin using the intraoperative imaging system. FIG. 4 shows images taken in white light (a, d, g), NIR fluorescence (b, e, h), and white light/NIR fluorescence merge (c, f, i) immediately post-injection (a, b, c), at 3 minutes post-injection (d, e, f) and post-resection (g, h, i). The arrows in images e, f, h, and i indicate the location of the SLN.

A series of water-stable (InAs)/ZnSe (core)/shell nanocrystals designed for in vivo biological applications was synthesized. The nanocrystals had fluorescence emission peaks ranging from 750 to 920 nm, with quantum efficiencies in water as high as 6-9%, and particle sizes ranging from 4 to 7 nm.

For use in nanocrystal preparation, $As(SiMe_3)_3$ was synthesized according to the literature (see V. G. Becker, et al., *Z. Anorg. Allg. Chem.* 1980, 462, 113, which is incorporated by reference in its entirety). Dihydrolipoic acid (DHLA) was synthesized according to the literature (see I. C. Gunsalus, et al., *J. Am. Chem. Soc.* 1956, 78, 1763, which is incorporated by reference in its entirety). Tri-n-octylphosphine selenide (1.5 M) was prepared by stirring selenium shot (12 g) in tri-n-octylphosphine (100 mL, 97%, Strem) overnight. $ZnEt_2$ (>95%, Strem) was passed through a 0.2 μm syringe filter prior to use. $In(OAc)_3$ (99.99%, Alfa Aesar), oleic acid (99%, Alfa Aesar), 1-octadecene (90%, Aldrich), tri-n-octylphosphine (TOP, 97%, Strem), butanol (HPLC grade, Omnisolve, EMD), ethanol (200 proof, dehydrated, ACS grade, Pharmco), hexane (HPLC grade, Omnisolve, EMD), and water (reagent grade, Ricca) were used as received.

(InAs)/ZnSe (core)/shell nanocrystals were synthesized in two steps. First, InAs cores were prepared via high-temperature injection of the arsenic precursor into a mixture of the indium precursor and a stabilizing ligand in a high-boiling solvent to form InAs nuclei, followed by a prolonged period of stirring at a slightly lower temperature to grow the cores. Next, a shell of a second, higher band gap semiconductor, ZnSe, was grown on the cores to electronically passivate and chemically stabilize them. See, for example, C. B. Murray, et al., *J. Am. Chem. Soc.* 1993, 115, 8706; M. A. Hines, and P. Guyot-Sionnest, *J. Phys. Chem.* 1996, 100, 468; and B. O. Dabbousi, et al., *J. Phys. Chem. B* 1997, 101, 9463; each of which is incorporated by reference in its entirety.

More particularly, InAs cores were synthesized by injecting a solution of $As(SiMe_3)_3$ (0.25 mmol) in 1-octadecene (1 mL, previously degassed under vacuum at 90° C. for 1 hour or more) into a round-bottom flask containing previously degassed (under vacuum at 90° C. for 1 hour or more) $In(OAc)_3$ (0.375 mmol), oleic acid (0.75 mmol), and 1-octadecene (5 mL) stirring rapidly at 300° C. The temperature was allowed to cool to 270° C. and stirring was continued for 60 minutes to grow the cores. Next, a shell of ZnSe was grown on the cores. For immediate overcoating with ZnSe, the temperature was either held at 270° C. or allowed to cool quickly to 170° C. Then a previously prepared solution of $ZnEt_2$ (0.2-0.3 mmol) and tri-n-octylphosphine selenide (0.2-0.6 mmol) in 1-octadecene (6 mL, degassed) or TOP (6 mL) was added to the reaction mixture, over the course of 20 minutes to 8 hours, through an additional funnel or through a capillary column (149 μm inner diameter, fused silica with polyimide coating, Polymicro Technologies) attached to a syringe and syringe pump. When the InAs cores were isolated from the growth solution before overcoating, this was achieved by precipitating the nanocrystals with approximately equal amounts of butanol and ethanol followed by centrifugation. The resulting dark brown powder was redispersed in hexane and again precipitated with butanol and ethanol, one to three times more, followed by filtration through a 0.1 μm syringe filter, all in an inert atmosphere glove box. The InAs cores in hexane were then added to a round-bottom flask containing TOP (6 mL). The hexane was removed under vacuum and then the contents of the flask heated to 170-270° C., at which point the zinc and selenium precursors were added as described above. The (InAs)/ZnSe (core)/shell nanocrystals were isolated by several cycles of precipitation with butanol and ethanol, centrifugation, and redispersed in hexane. Absorption data was collected with a Hewlett Packard 8453 UV-vis spectrometer. Emission spectra were obtained using an Ocean Optics S2000 fiber optic spectrometer. The WDS measurements were performed on a JEOL SEM 733 electron microscope operated at 15 kV. The TEM and high-resolution TEM (HRTEM) experiments were done with a JEOL 2000FX and a JEOL 2010, respectively, operated at 200 kV.

In order to water-solubilize the nanocrystals, 200 mg of DHLA was added to 64 mg of dried (InAs)/ZnSe nanocrystals. This mixture was stirred for two hours at 70° C., then ~0.5 mL DMF was added. To this clear solution was added 1 mL $H_2O$, causing immediate cloudiness. The addition of two drops of a 1.0 M solution of sodium tert-butoxide in water resulted in a clear solution again. The water-soluble nanocrystals were isolated from excess reagents by several cycles of precipitation with tetrahydrofuran and hexane, centrifugation, and redispersed in pH 7 water.

Figure 5:
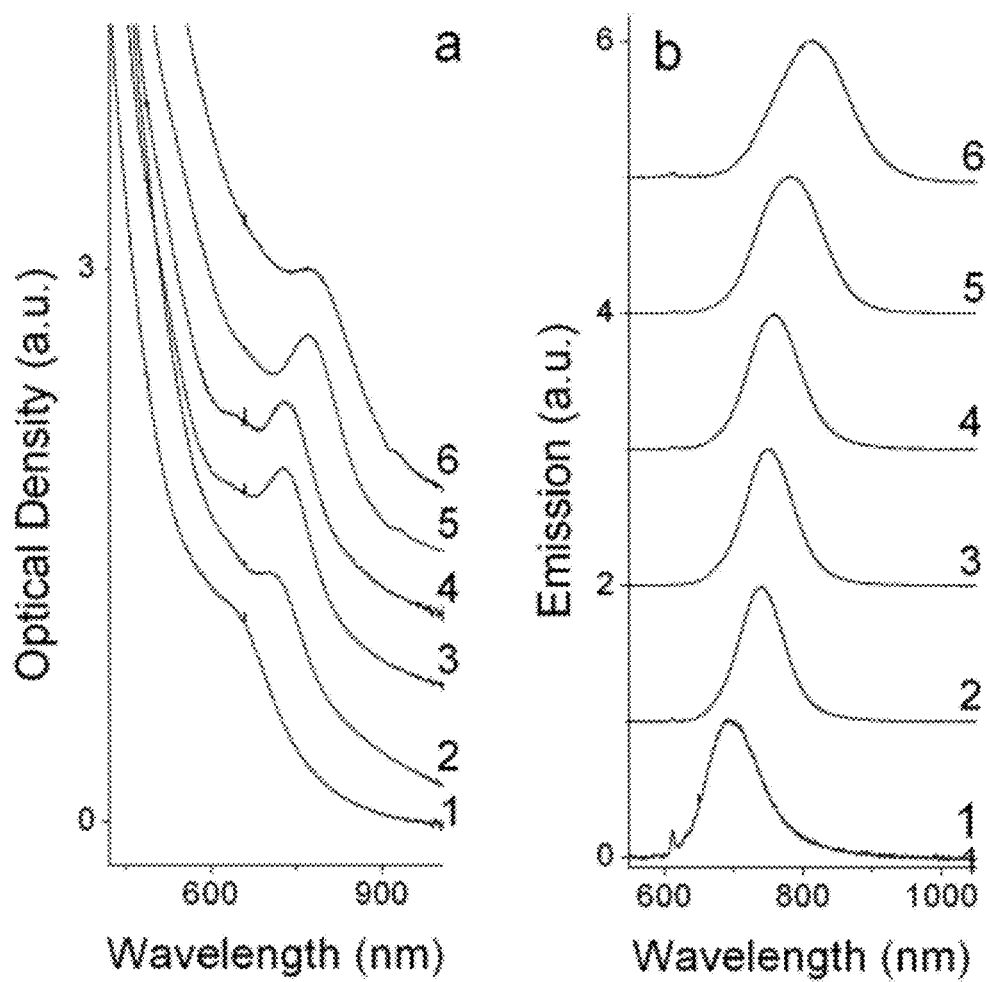
FIGS. 5A-5B are graphs depicting absorbance and fluorescence spectra of semiconductor nanocrystals.

The InAs cores can be isolated from the reaction mixture prior to the addition of the semiconductor shell, or alternatively, the shell can be grown on the cores immediately. A mixture of the zinc and selenium precursors in a high-boiling organic solvent was added dropwise to the solution of InAs cores at moderate temperatures over times ranging from 20 minutes to 8 hours. Either an addition funnel or a syringe pump with a capillary column was used for the addition. Consistent addition of the precursors over about two hours resulted in the highest-quality shells. See FIG. 5, which shows absorption and emission spectra for a size series of InAs cores and (InAs)ZnSe core-shell nanocrystals, with emission maxima ranging from 694 to 812 nm. Specifically, in FIGS. 5a and 5b the numbered spectra correspond to: (1) InAs with absorption peak, emission peak, and emission full-width at half-maximum (FWHM) of 645, 694, and 85 nm, respectively, (2) InAs, 710, 739, 77 nm, (3) (InAs)ZnSe, 726, 749, 82 nm, (4) (InAs)ZnSe, 731, 757, 85 nm, (5) (InAs) ZnSe, 768, 781, 109 nm, and (6) (InAs)ZnSe, 771, 812, 121 nm.

When Cd was incorporated into the shell, (i.e., (InAs)/ $Cd_xZn_{1-x}Se$ nanocrystals) at nominal Cd/Zn molar ratios from 0.16 to 0.25, the emission was red-shifted to wavelengths as long as 920 nm. The red-shift was due to the smaller band offsets between CdSe and InAs (0.46 and 0.92 eV for the conduction and valence bands, respectively) compared to ZnSe and InAs (1.26 and 0.99 eV). See, for example, Y. Cao, and U. Banin, *J. Am. Chem. Soc.* 2000, 122, 9692, which is incorporated by reference in its entirety.

Figure 6:
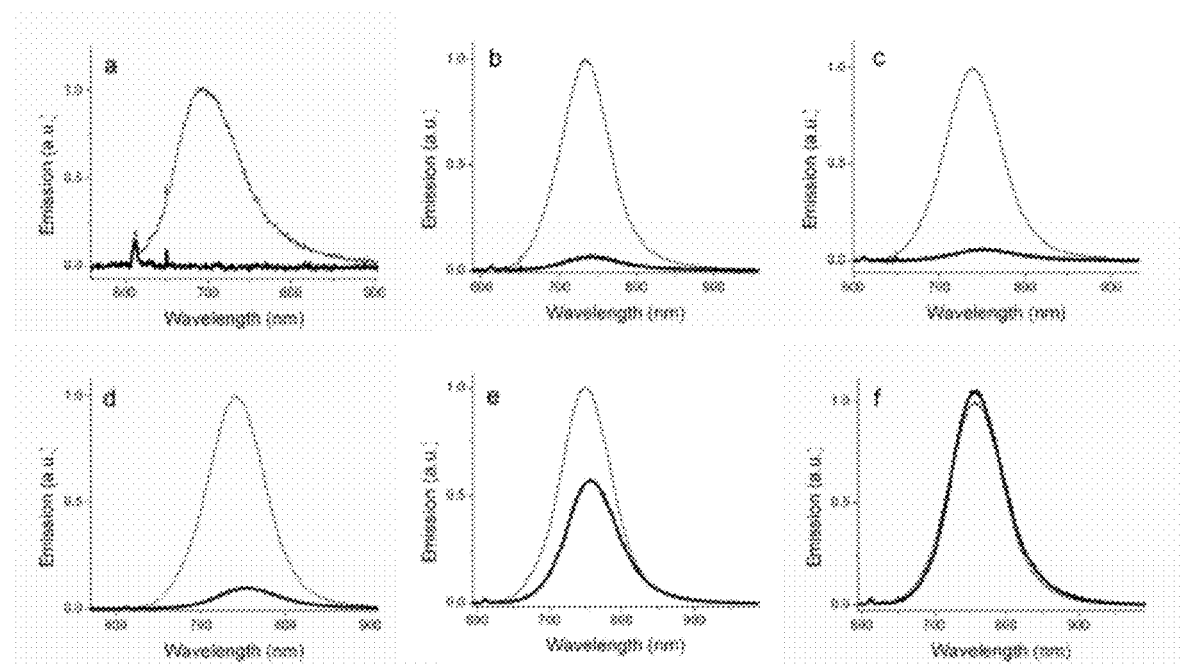
FIGS. 6A-6F are graphs depicting fluorescence spectra of semiconductor nanocrystals.

The small InAs cores were quite unstable to air or water and rapidly lost quantum efficiency even in hexane solutions exposed to air. Adding the ZnSe shell permitted the maintenance of emission intensity. See FIG. 6, which shows emission spectra of InAs and (InAs)/ZnSe (core)/shell nanocrystals immediately after aliquots were removed from the reaction vessel during growth and diluted in hexane (thinner lines), and after the same aliquots in hexane were exposed to air in the laboratory for 40 hours (thicker lines). FIGS. 6a-6(c) correspond to InAs cores as their size and emission wavelength increased during growth, at (a) 1 minute, (b) 30 minutes, and (c) 60 minutes after injection of the $As(SiMe_3)_3$. FIGS. 6d-6f correspond to a time trace of the overcoating procedure, at (d) 63 minutes, (e) 78 minutes, when the overcoating was approximately half finished, and (f) 104 minutes, when the overcoating was completed. The presence of this shell was confirmed by wavelength dispersive spectroscopy (WDS) and transmission electron microscopy (TEM).

Figure 7A:
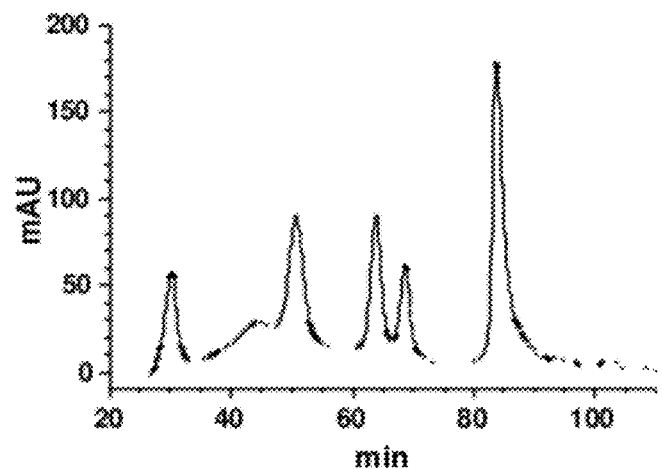
FIGS. 7A-7B are graphs depicting gel filtration chromatography data.
Figure 7B:
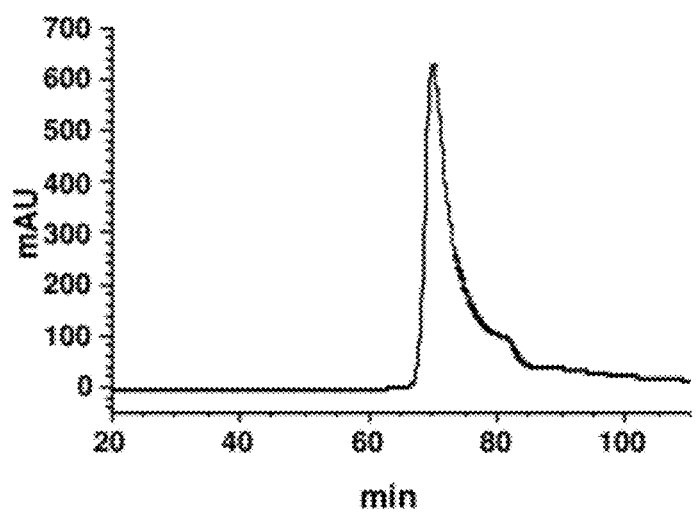

Total hydrodynamic diameter can be an important consideration for the biological application of chromophores (see, for example, S. Kim, et al., *Nat. Biotechnol.* 2004, 22, 93; and A. M. Evens, et al., *Leuk. Res.* 2004, 28, 891, each of which is incorporated by reference in its entirety). Since it can be easier to increase the hydrodynamic diameter of a particle by the addition of extra layers than to reduce the size of a particle, it can be desirable to make semiconductor nanocrystals as small as possible in water. Hydrodynamic diameter can be increased by adding, for example, a polyethylene glycol to a particle. A hydrodynamic diameter of 5.4 nm was determined by gel filtration chromatography for a sample of water soluble (InAs)/ZnSe nanocrystals. FIG. 7A shows gel filtration results for the size standards blue dextran (2 MDa, 30.2 min, 29.5 nm hydrodynamic diameter), thyroglobulin (669 kDa, 50.8 min, 18.8 nm), ADH (150 kDa, 63.8 min, 10.1 nm), ovalbumin (44 kDa, 68.6, 6.1 nm), and lysozyme (14.3 kDa, 83.7 min, 3.9 nm). As shown in FIG. 7B, the (InAs)/ZnSe nanocrystals eluted at 70.1 min, corresponding to a 5.4 nm hydrodynamic diameter, equivalent to that of a 32.9 kDa protein.

Figure 8:
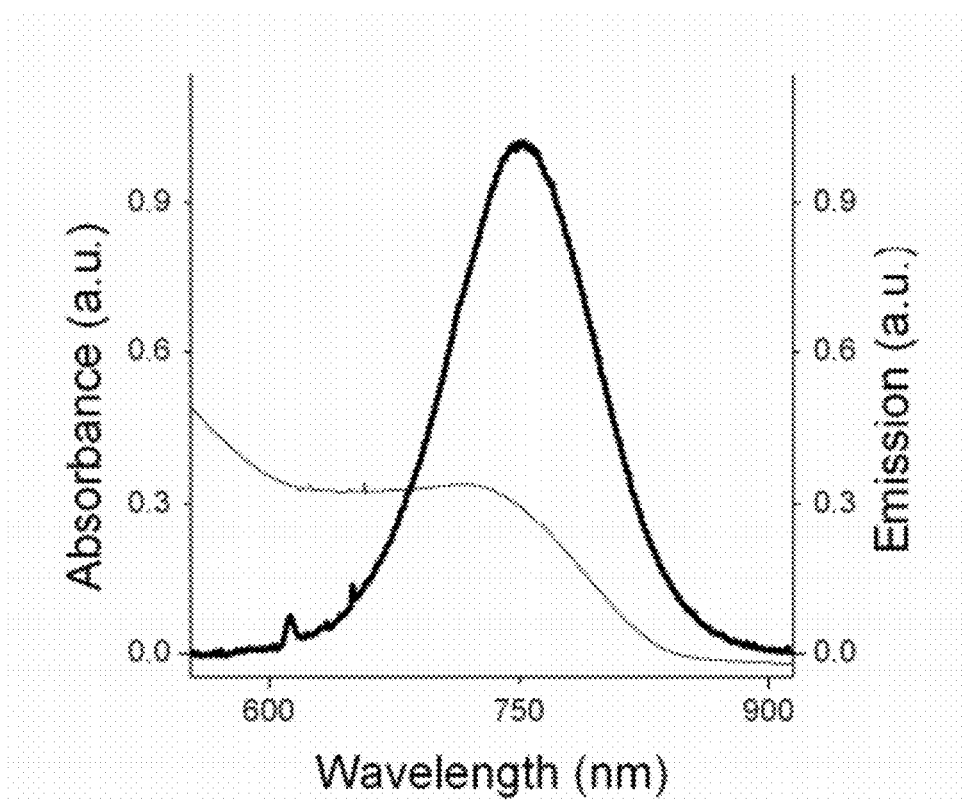
FIG. 8 is a graph depicting absorbance and fluorescence spectra of semiconductor nanocrystals.
Figure 9A:
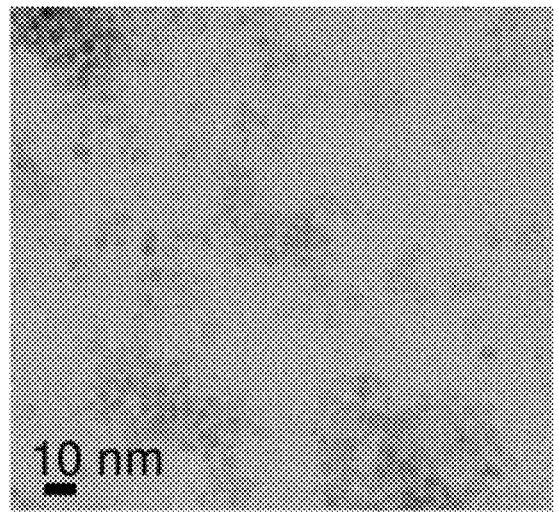
FIGS. 9A-9B are TEM images of semiconductor nanocrystals.
Figure 9B:
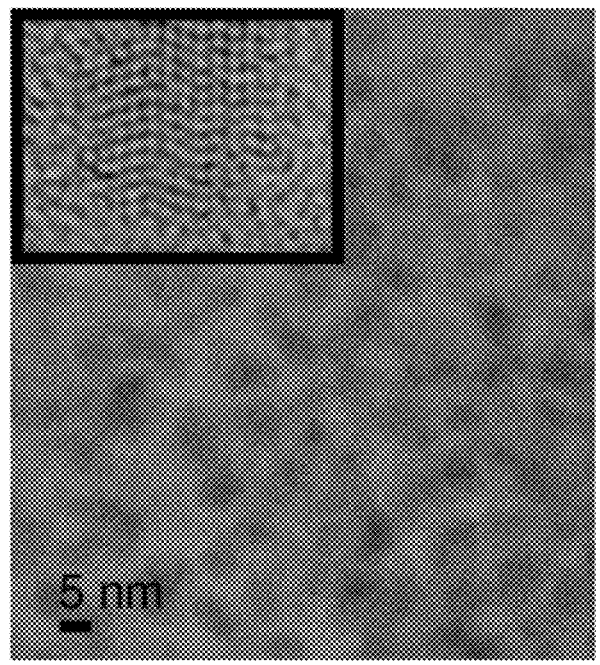

In order to increase water solubility, some or all of the native, hexane-soluble oleic acid and tri-n-octylphosphine ligands on the nanocrystal surface were replaced with water-soluble ligands. To minimize the hydrodynamic size, single molecule ligands were used, as opposed to oligomeric or polymeric ligands. The best results were achieved with dihydrolipoic acid (DHLA), a dithiol previously shown to stabilize (CdSe)ZnS core-shell nanocrystals in water. See, for example, F. V. Mikulec, Ph.D. thesis, Massachusetts Institute of Technology (US), 1999, and H. Mattoussi, et al., *J. Am. Chem. Soc.* 2000, 122, 12142, each of which is incorporated by reference in its entirety. Ligand-exchange with DHLA imparted solubility in polar organic solvents like N,N-dimethylformamide (DMF). Addition of aqueous base deprotonated the DHLA ligands, imparting water-solubility, which was maintained after lowering the pH to 7. FIG. 8 shows the absorption (thin line) and emission (thick line) spectra of DHLA-stabilized (InAs)/ZnSe nanocrystals at pH 7 in water. The emission peak maximum is 752 nm with a FWHM of 102 nm. The nanocrystals were stable in water for many days. Polydentate ligands (such as, for example, bidentate DHLA) can be preferred to monodentate ligands, such as α,ω-carboxylic acid thiols, e.g. mercaptoacetic acid and mercaptopropionic acid. Monodentate ligands can be more easily lost from the nanocrystal surface in solution. In addition, α,ω-carboxylic acid thiols can be toxic, whereas DHLA is non-toxic and even sold as a dietary supplement. The diameters of the (InAs)/ZnSe core-shell nanocrystals ranged from approximately 4 to 7 nm, based on TEM measurements. FIG. 9A shows a TEM image of 5.5 nm diameter (InAs)/$Cd_{0.14}Zn_{0.86}Se$ (core)/shell nanocrystals, water-solubilized by ligand-exchange with 11-mercaptoundecanoic acid. FIG. 9B shows a HRTEM image of the same nanocrystals as in FIG. 9A, but before ligand-exchange and water-solubilization. The inset is an enlarged view of a single nanocrystal from this sample. The highly crystalline, but not defect-free, structure can clearly be seen.

Figure 10:
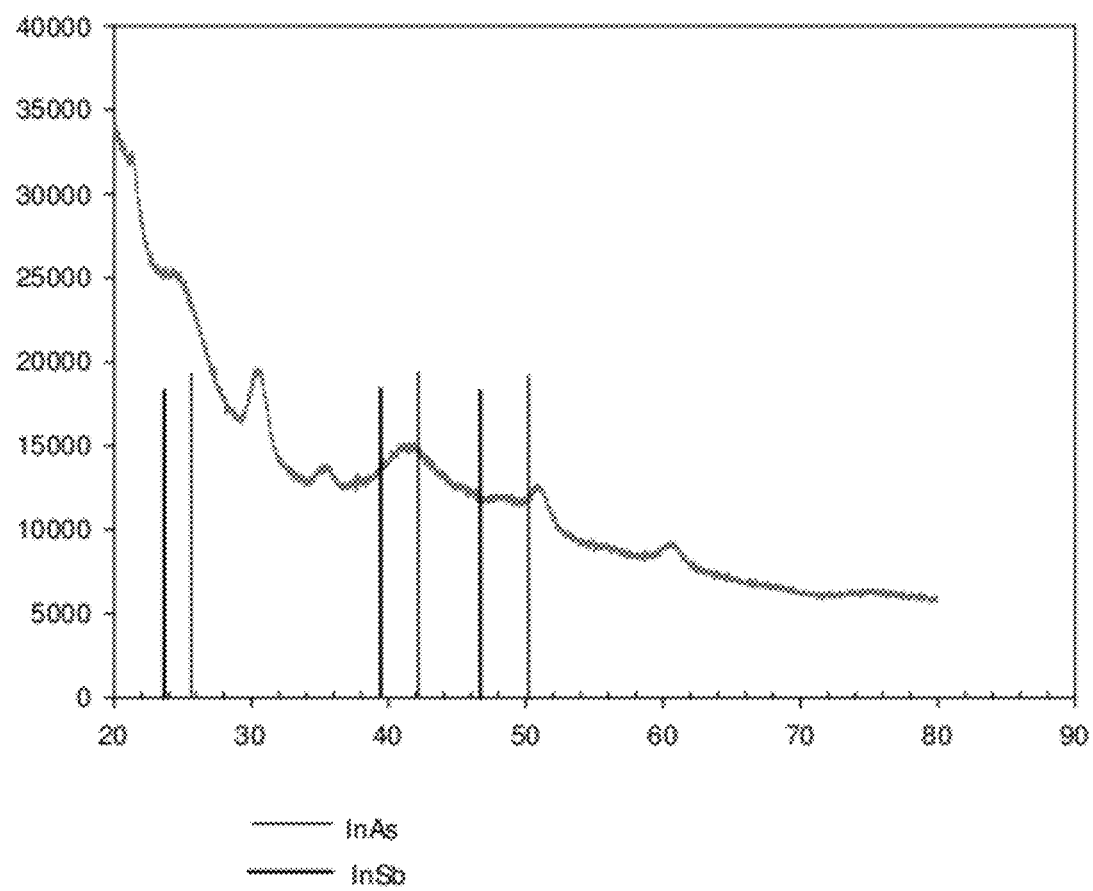
FIG. 10 is a graph depicting X-ray diffraction data for semiconductor nanocrystals.
Figure 11A:
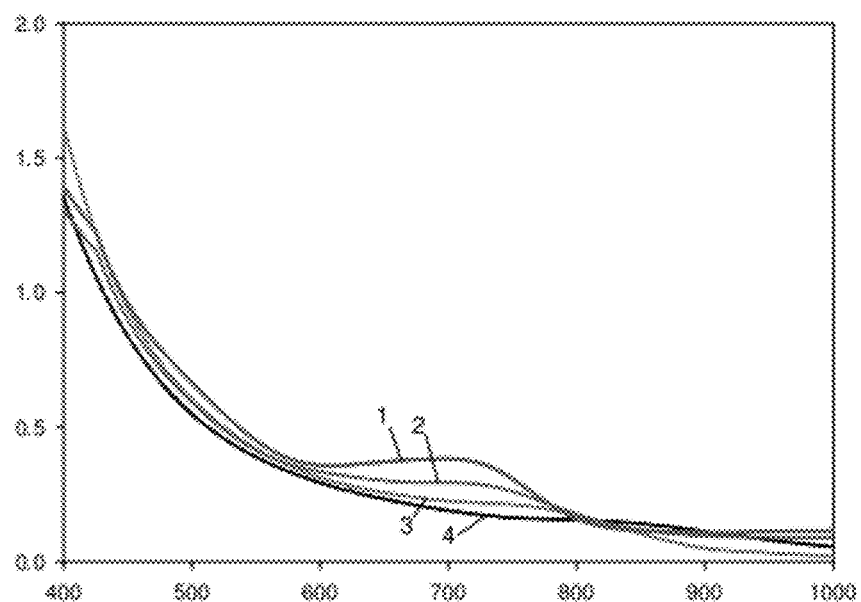
FIGS. 11A-11B are graphs depicting absorbance and fluorescence spectra of semiconductor nanocrystals.
Figure 11B:
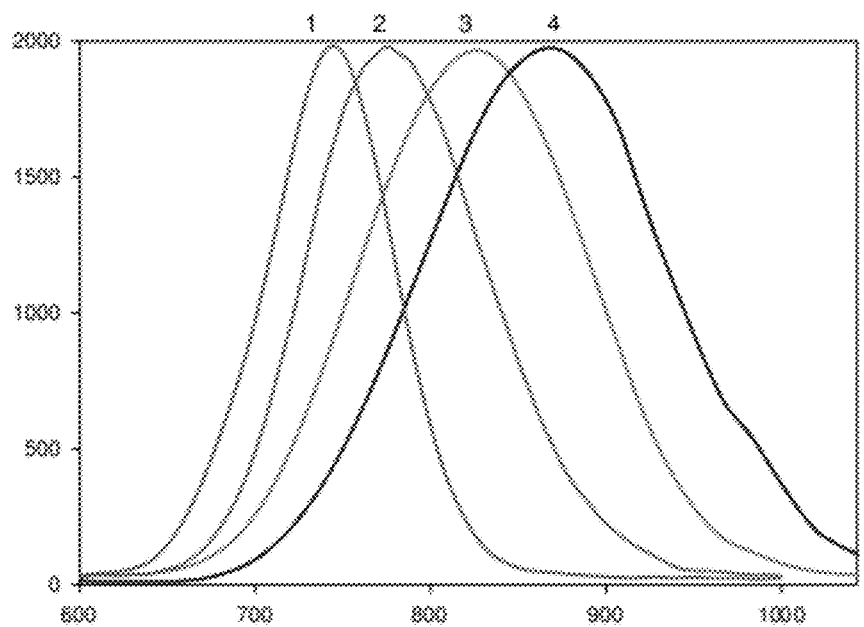

Near IR fluorescent emission can also be achieved by $InAs_xSb_{1-x}$ nanocrystals. The synthesis of $InAs_xSb_{1-x}$ nanocrystals was similar to that for $InAs_xP_{1-x}$ nanocrystals. Tris(trimethylsilyl)antimony was used as the antimony precursor. The power XRD pattern (see FIG. 10) showed this material to be a homogeneous alloy, with a zinc blende structure like pure InAs and InSb. FIGS. 11A and 11B present absorbance and fluorescence spectra for InAsSb nanocrystal prepared with various ratios of As:Sb precursors (trace 1, 100:0 As:Sb; trace 2, 88:12 As:Sb; trace 3, 67:33 As:Sb; and trace 4, 50:50 As:Sb).

Other embodiments are within the scope of the following claims.

What is claimed is:

1. A semiconductor nanocrystal comprising a core including a first semiconductor material, the first semiconductor material being a III-V alloy having the formula $M^1_iM^2_jE^1_xE^2_y$, wherein $M^1$ and $M^2$ are each independently a group III element; $E^1$ and $E^2$ are each independently a group V element; and i, j, x and y are each independently a non-negative number, the nanocrystal having a hydrodynamic diameter between 5 nm and 15 nm.

2. The semiconductor nanocrystal of claim 1, wherein the first semiconductor material includes indium or gallium.

3. The semiconductor nanocrystal of claim 2, wherein the first semiconductor material includes nitrogen, phosphorus, arsenic, or antimony.

4. The semiconductor nanocrystal of claim 1, further comprising an overcoating on a surface of the core, the overcoating including a second semiconductor material.

5. The semiconductor nanocrystal of claim 4, wherein the second semiconductor material includes a II-VI or a III-V semiconductor material.

6. The semiconductor nanocrystal of claim 4, further comprising a second overcoating on a surface of the core, the overcoating including a third semiconductor material.

7. The semiconductor nanocrystal of claim 6, wherein the second semiconductor material is a III-V semiconductor material and the third semiconductor material is a II-VI semiconductor material.

8. The semiconductor nanocrystal of claim 1, further comprising a ligand on a surface of the semiconductor nanocrystal.

9. The semiconductor nanocrystal of claim 8, wherein the semiconductor nanocrystal is water soluble.

10. The semiconductor nanocrystal of claim 1 further comprising an overcoating including a second semiconductor material on a surface of the core; wherein the second semiconductor material includes an alloy.

11. The semiconductor nanocrystal of claim 10, wherein the II-VI alloy has the formula $M^1_iM^2_jE^1_xE^2_y$, wherein $M^1$ and $M^2$ are each independently a group II element; $E^1$ and $E^2$ are each independently a group VI element; and i, j, x and y are each independently a non-negative number.

12. A fluorescent particle comprising the semiconductor nanocrystal of claim 1.

13. A semiconductor nanocrystal comprising: a core including a first semiconductor material having the formula $M^1_iM^2_jE^1_xE^2_y$, wherein $M^1$ and $M^2$ are each independently a group III element; $E^1$ and $E^2$ are each independently a group V element; and i, j, x and y are each independently a non-negative number, the nanocrystal having a hydrodynamic diameter between 5 nm and 15 nm; a first overcoating including a second semiconductor material on a surface of the core; and a second overcoating including a third semiconductor material on a surface of the first overcoating.

14. The semiconductor nanocrystal of claim 13, wherein the second semiconductor material is selected to electronically passivate the core.

15. The semiconductor nanocrystal of claim 14, wherein the third semiconductor material is selected to chemically stabilize the first overcoating.

16. The semiconductor nanocrystal of claim 13, wherein the first overcoting including a III-V semiconductor material.

17. The semiconductor nanocrystal of claim 16, wherein the second overcoating includes a II-VI semiconductor material.

18. The semiconductor nanocrystal of claim 13, further comprising a ligand on a surface of the semiconductor nanocrystal.

19. The semiconductor nanocrystal of claim 18, wherein the semiconductor nanocrystal is water soluble.

* * * * *